(12) United States Patent
Kuhara et al.

(10) Patent No.: US 6,340,831 B1
(45) Date of Patent: Jan. 22, 2002

(54) PHOTODIODE AND PHOTODIODE MODULE

(75) Inventors: Yoshiki Kuhara; Hiromi Nakanishi; Hitoshi Terauchi, all of Osaka (JP)

(73) Assignee: Sumitomo Electric Industries, Ltd., Osaku (JP)

( * ) Notice: Subject to any disclaimer, the term of this patent is extended or adjusted under 35 U.S.C. 154(b) by 0 days.

(21) Appl. No.: 09/525,222

(22) Filed: Mar. 14, 2000

Related U.S. Application Data

(62) Division of application No. 09/146,101, filed on Sep. 3, 1998, now Pat. No. 6,043,550.

(30) Foreign Application Priority Data

Sep. 3, 1997 (JP) .............................. 9-256107
Jul. 21, 1998 (JP) ........................... 10-205067

(51) Int. Cl.[7] ...................... H01L 31/042; H01L 27/142
(52) U.S. Cl. ...................................... 257/461; 257/233
(58) Field of Search ................................. 257/233, 461, 257/462; 438/48

(56) References Cited

U.S. PATENT DOCUMENTS

| | | | |
|---|---|---|---|
| 5,216,327 A | 6/1993 | Ritchie et al. | 250/214.1 |
| 5,420,418 A | 5/1995 | Fujimura | 315/39.53 |
| 5,707,745 A | 1/1998 | Forrest et al. | 428/432 |
| 5,731,621 A | 3/1998 | Kosai | 257/440 |

FOREIGN PATENT DOCUMENTS

| | | |
|---|---|---|
| EP | 0 773 591 | 5/1997 |
| JP | 4-111479 | 4/1992 |
| JP | 6-174917 A * | 6/1994 |

OTHER PUBLICATIONS

Shishikura et al., "A Waveguide PIN–PD with Wide Coupling Tolerance", The Institute of Electronics, Information and Communication Engineers, Mar. 27–30, 1995, p. 386.
Oikawa et al., "Packaging Technology for a 10-Gb/s Photoreceiver Module", Journal of Lightwave Technology, Feb. 1994, vol. 12, No. 2, pp. 343–352.
Hillerich et al., "Self–Aligned Flat–Pack Fibre–Photodiode Coupling", Electronics Letters, Jul. 21, 1988, vol. 24, No. 15, pp. 918–919.
Patent Abstracts of Japan, vol. 97, No. 7, Jul. 31, 1997 & JP 09 083010 A (Nippon Telegr), Mar. 28, 1997.
Patent Abstracts of Japan, vol. 095, No. 006, Jul. 31, 1995 & JP 07 086630 A (Hitachi Cable, Ltd.), Mar. 31, 1995.
Patent Abstracts of Japan, vol. 018, No. 174 (E–1530), Mar. 24, 1994 & JP 05 343728 A (Sumitomo Electric Ind Ltd.) Dec. 24, 1993.
Patent Abstracts of Japan, vol. 012, No. 440 (E–684), Nov. 18, 1988 & JP 63 170978 A (Mitsubishi Electric Corp.), Jul. 14, 1988.

* cited by examiner

*Primary Examiner*—Allan R. Wilson
(74) *Attorney, Agent, or Firm*—Pillsbury Winthrop LLP

(57) ABSTRACT

A photodiode which senses only $\lambda 2$ without WDM in optical communication systems containing two signals of different wavelengths $\lambda 1$ and $\lambda 2$. The photodiode has a filter layer whose band gap wavelength $\lambda g$ satisfies an inequality of $\lambda 1 < \lambda g < \lambda 2$ for annihilating $\lambda 1$. For vanishing tails of signals, the peripheral pn-junction is formed around the central pn-junction. In the case, an n-electrode is mounted on both the peripheral p-region and the peripheral n-region.

22 Claims, 19 Drawing Sheets

PHOTODIODE AND PHOTODIODE MODULE

This is a division of application Ser. No. 09/146,101, filed Sep. 3, 1998 now U.S. Pat. No. 6,043,550.

BACKGROUND OF THE INVENTION

1. Field of the Invention

This invention relates to a photodiode as a light receiving device and photodiode module combining a photodiode and a light emitting device for bilateral or unilateral optical communication of information between a base station and a plurality of subscribers by transmitting two light signals having different wavelengths $\lambda 1$ and $\lambda 2$ in a unilateral direction or bilateral directions passing through an optical fiber.

This application claims the priority with respect to Japanese Patent Application No.256107/1997 filed on Sep. 3, 1997 which is incorporated herein by reference.

2. Description of the Related Art

Explanation of Optical Bilateral Communication

Recently semiconductor laser diodes (LD) and semiconductor photodiodes (PD) have enhanced their properties and the transmission loss of optical fibers has been lowered. Therefore, the transmission of various sorts of information by light have been feasible. Transmission by using light is referred to as "optical communication". Telephones, facsimiles, television image signals and so on are various known media for transmitting information. Various attempts to utilize light with long wavelengths, for example, a wavelength of 1.3 $\mu$m and wavelengths of 1.5 to 1.6 $\mu$m, are succeeding in the optical communication field. Nowadays, a new system for sending and receiving signals is being developed, in which light signals can be sent in bilateral directions simultaneously through a single optical fiber. This system is called "bilateral communication", because signals can be transmitted in bilateral directions. The most noticeable advantage is that the bilateral communication requires only one optical fiber.

FIG. 1 explains the principle of the bilateral multicommunication using two light signals of different wavelengths. An optical fiber connects one base station to one of many subscribers. In FIG. 1, only one subscriber is shown for simplicity, but actually, there are many branch points, and an optical fiber from the base station is branched into a plurality of optical fibers that are connected to respective subscriber devices.

In the base station, the signal from a TV, a phone or the like is amplified and processed to be a digital or an analog signal, and such an amplified signal drives a laser diode (LD1) of $\lambda 1$. The light signal having a wavelength $\lambda 1$ enters an optical fiber 1, and then to an intermediate optical fiber 3 via a wavelength division multiplexer (WDM) 2. The signal introduced in the optical fiber 3 is transmitted to an optical fiber 5 via a wavelength division multiplexer (WDM) 4 set up on the subscriber side, and is received by a photodiode (PD2), whereby the signal is changed to an electric signal (P3). The electric signal (P3) is amplified and processed by a device on the subscriber side, and is regenerated as the voice of a phone or television images. The signal going from the base station to the subscriber side is called a "downward signal", and the direction of the flow is called a "downward direction".

On the other hand, on the side of a subscriber, a laser diode LD2 converts a signal (P4) from a phone or a facsimile into a light signal having a wavelength of $\lambda 2$. The $\lambda 2$ light enters an optical fiber 6, is introduced into the intermediate optical fiber 3 by the wavelength division multiplexer (WDM) 4, and enters photodiode PD1 passing through the wavelength division multiplexer 2 of the base station. A device equipped in the base station converts the $\lambda 2$ light signal to an electric signal using photodiode PD1. This electric signal is appropriately converted and/or processed. The direction from the subscriber side to the base station is called an "upward direction".

Explanation of Wavelength Division Multiplex

Both the base station and the subscriber side must be able to distinguish and separate two sorts of light having different wavelengths for the implementation of optical bilateral communication using a single optical fiber. The wavelength division multiplexers 2 and 4 shown in FIG. 1 provide that capability. Such a wavelength division multiplexer combines two sorts of light having different wavelengths of $\lambda 1$ and $\lambda 2$ and couples the combined light into only one optical fiber or selects one sort of light from light having different wavelengths, and couples the light of one wavelength to only one optical fiber. Therefore, the wavelength division multiplexer plays an extremely important role in carrying out multiwavelength bilateral communication.

There are several kinds of wavelength division multiplexers, which have been proposed. These wavelength division multiplexers will be explained by referring to FIG. 2 to FIG. 4. A wavelength division multiplexer shown by FIG. 2 is made from optical fibers or an optical waveguide. Two optical paths 8 and 9 are close to each other at a part 10 of the paths, and the exchange of optical energy is carried out here. Various kinds of couplings can be realized by changing gap D and length L of the neighboring part 10.

When the light having a wavelength $\lambda 1$ enters the optical path 8 and the light with a wavelength $\lambda 2$ enters the optical path 9, both the $\lambda 1$ wavelength light and the $\lambda 2$ wavelength light exit via an optical path 11, and no light enters an optical path 12. Hence, the $\lambda 1$ light from a port P1 and the $\lambda 2$ light from a port P2 appear in a port P3. No light appears in a port P4. The $\lambda 1$ light never enters the neighboring optical fiber, but all of the $\lambda 2$ light enters the neighboring optical fiber because the $\lambda 2$ satisfies the condition of phase. Since such a wavelength division multiplexer is made from optical fibers or an optical waveguide, there is an advantage of little polarization dependency.

The route of light passing through an optical fiber or a waveguide has reversibility. FIG. 3 shows a practical device for the wavelength division multiplexer shown in FIG. 2 in the bilateral communication. The $\lambda 1$ light from P1 enters the optical fiber 8, and exits via P3. The $\lambda 2$ light entering P3 exits via P2. Here, this WDM can be used as the WDMs 2 and 4 shown in FIG. 1.

FIG. 4 shows a wavelength division multiplexer provided with a multi-layer mirror. This multi-layer mirror is made of two glass blocks 13 and 14 shaped like isosceles triangle columns and a dielectric multi-layer 15 formed on the slanting surfaces of the glass blocks 13 and 14. All of the $\lambda 1$ light passes through but the all of the $\lambda 2$ light is reflected on the multi-layer mirror by adjusting and combining the refractive index and the thickness of the dielectric multi-layer. Here, there exists the dependency of polarization because the incoming light is reflected at an angle of 45°. This wavelength division multiplexer is utilized as the wavelength division multiplexers 2 and 4 shown in FIG. 1. Such a kind of wavelength division multiplexer is called a "wavelength dividing or combining device" or called a "WDM". The optical fiber type WDM and the glass block type WDM mentioned above have already been on the market.

The light sending and receiving module on the subscriber side will be explained by referring to FIG. 5. In FIG. 5, an end of an optical fiber 16 leading from the base station to each subscriber is connected to an indoor optical fiber 18 by an optical connector 17. An indoor ONU module equipped on the subscriber side is provided with an optical fiber WDM (Wavelength Division Multiplexer) 21. The WDM has another optical fiber 19 which is connected to the fiber 18 at a coupling portion 20 via evanescent waves. The optical fibers 18 and 19 are wavelength-selectively coupled with modules in the WDM 21. The optical fiber 18 is coupled with an LD module 25 by an optical connector 22. The optical fiber 19 is coupled with a PD module 27 via an optical connector 23.

The LD 25 and the optical fiber 24 are of the upward-direction type. The 1.3 $\mu$m-band light is transmitted from the subscriber side to the base station. The optical fiber 26 and the PD module 27 are of the downward-direction type. For example, the 1.55 $\mu$m-band light signal from the base station is converted into an electric signal by the PD module. The LD 25, which is a transmitting device, includes circuits capable of amplifying and modifying the signals of telephones and facsimiles and a semiconductor laser capable of converting electric signals to light signals. The PD module 27, which is a light receiving device, includes a photodiode capable of converting light signals such like TV signals from the base station, telephone and so on to electric signals, an amplifier, a demodulator and so on.

The wavelength division multiplexer 21 can separate the 1.55 $\mu$m-band light from the 1.3 $\mu$m-band light. In this example, the 1.3 $\mu$m-band light is used as an upward-direction signal, and the 1.55 $\mu$m-band light is used as a downward-direction signal. In this case, light having two different wavelengths must effectively be separated by the wavelength division multiplexer.

This invention relates to an improvement for both a photodiode and a photodiode module for use in bilateral communication of using light signals having two different wavelengths.

Explanation of Prior Photodiode Module

A known semiconductor photodiode module will be explained by referring to FIG. 6. In FIG. 6, a photodiode chip 41 is fitted on an upper surface of a header 42 by die-bonding. The bottom surface of the header 42 is provided with lead pins 43. The upper surface of the header 42 is covered with a cap 44. A window 45 for penetrating light is formed at the center part of the cap 44. A cylindrical holder 46 is fixed to the header 42 outside of the cap 44. The holder 46 is necessary for supporting a lens 47.

A conical housing 48 is fixed on the lens holder 46. An edge of an optical fiber 50 is settled by a ferrule 49 which is sustained by the housing 48. The tips 51 of the ferrule 49 and the optical fiber 50 are slantingly polished.

The positions of the holder 46, the housing 48 and the ferrule 49 are determined for the alignment of the photodiode chip 41, for conducting light into the optical fiber 50 and investigating the output of the photodiode chip 41. The wavelength feasible to be received is decided by semiconductor layers of the photodiode. In the case of visible rays, the photodiode made from silicon (Si) can be used. However, since this invention is intended for ONU modules using near infrared-rays, Si-photodiodes are unsuitable. A compound semiconductor having an InP substrate is required for sensing infrared-rays.

Explanation of Prior Semiconductor Photodiode Chip

A conventional photodiode, which is used for the light having long wavelengths and has an InP substrate, will be explained. FIG. 7 is a sectional view of a known photodiode chip for light communication.

An n-type InP buffer layer 53, an n-type InGaAs light receiving layer (light absorbing layer) 54 and an n-type InP window layer 55 are epitaxially grown in this order on an n-type InP substrate 52. A p-type region 56 is formed by diffusing zinc (Zn) into the upper central part of the chip. The Zn-diffusion reaches to the middle depth of the n-type InGaAs light receiving layer. Hence, the Zn-diffusion area becomes a p-type InP window layer and a p-type InGaAs light receiving layer. There occurs a pn-junction inside of the InGaAs light receiving layer.

A ring p-electrode 57 is fitted on the Zn-diffusion region 56. Light enters the inner part enclosed by the ring p-electrode 57. The light incident part is covered with an antireflection film 58. The outside of the p-electrode 57 is protected with a passivation film 59. An n-electrode 60 is formed on the rear surface of the substrate 52. Since the electrode is surely formed on the whole rear surface of the substrate, no light penetrates. This is one of the characteristics of conventional photodiodes.

In operation, the pn-junction is reverse-biased by supplying voltage between the p-electrode 57 and the n-electrode 60. Incident light emitted from the end of the optical fiber reaches the n-type InGaAs light receiving layer 54 passing through the anti-reflection film 58 at the center part, the p-type InP window layer, the p-type InGaAs light receiving layer and the pn-junction. The generation of electron-hole pairs is derived from the absorption of light into the light receiving layer. Electrons transfer toward the n-electrode and the holes move toward the p-electrode because of the reverse-bias of the pn-junction, and whereby current flows between the n-electrode and the p-electrode. The power of incident light is possible to be detected because the amount of absorbed photons corresponds to the current therebetween.

The InGaAs light absorbing layer can absorb the light having a wavelength of 1.3 $\mu$m and a wavelength of from 1.5 $\mu$m to 1.6 $\mu$m. The InP window layer never absorbs the light. A semiconductor has an inherent feature that it is permeable to light having a smaller energy than the bandgap, because the light cannot lift electrons of the valence band up to the conduction band. Hence, the semiconductor is a transparent to the light having a longer wavelength than the wavelength corresponding to the bandgap.

On the contrary, if the semiconductor has a sufficient thickness, the semiconductor can absorb all of the light having larger energy than the bandgap. Such light can lift electrons of the valence band up to the conduction band. When the bandgap of the semiconductor of the window layer is denoted by Egw, and the bandgap of the light absorbing layer (light receiving layer) is denoted by Egz, the light having an energy more than Egz and less than Egw, that is, Egz<hv<Egw, can pass the window layer and is sensed by the light receiving layer. Here, h is Planck's constant and v is an oscillation frequency (frequency). This photodiode is detectable for the light having an energy that is larger than the bandgap Egz of the absorbing layer and smaller than the bandgap Egw of the window layer.

Furthermore, in the InGaAs light receiving layer, the rate between In and Ga is predetermined from the condition of lattice matching between the InP substrate and the InGaAs light receiving layer. When InGaAs is written as $In_{1-x}Ga_xAs$, the mixed crystal rate x is determined to be one value. Hence, the bandgap of the InGaAs layer matching with the InP is determined from the value.

FIG. 8 shows the sensitivity property of the InGaAs photodiode shown by FIG. 7. The abscissa is the wavelength of light (μm) and the ordinate is the sensitivity (A/W). The sensitivity is low in the range less than 0.9 μm (P-region) and rises steeply at a wavelength of 0.95 μm. The sensitivity is increased monotonously in the range of from 1.0 μm to 1.5 μm (Q-region). The sensitivity goes down sharply from a wavelength of 1.7 μm (R-region) and the sensitivity falls down to zero at a wavelength of 1.75 μm.

As is well known, the equation $h\nu=hc/\lambda=E$ is established between the wavelength $\lambda$ and the energy E. Here, h is Planck's constant, $\nu$ is an oscillation frequency of light and c is the velocity of light. The bandgap Egw of the window layer (InP) determines the lowest limit of wavelength of sensitivity (0.95 μm). Since the light having energy higher than Egw is entirely absorbed by the window layer, the light never reaches the light receiving layer (absorbing layer).

The bandgap Egz of the absorbing layer (InGaAs) determines the upper limit of wavelength of sensitivity (1.67 μm). Since the light having energy less than Egz passes through the absorbing layer, the detector never senses the light.

The wavelength of P-region of FIG. 8 at which the sensitivity rises depends on the bandgap of the window layer, and the wavelength of R-region at which the sensitivity goes down depends on the bandgap of the absorbing layer.

Since this photodiode has such a wide range of sensitivity, it has enough to sense both the 1.3 μm light and the 1.55 μm light. Hence, the same photodiode can be used for detecting both the 1.3 μm light and the 1.55 μm light.

Further, the energy of a photon is $h\nu=hc/\lambda$. Theoretically, one photon makes an electron-hole pair and there occurs a current of 2q (q: elementary quantum of electronic charge), which would be realizable if the conversion efficiency were 100%. In other words, when the efficiency of the photodiode is 100%, the sensitivity is given by $2q\lambda/hc$ (A/W). This fact is related to the sensitivity increasing monotonously in Q-region ranging from 1.0 μm to 1.55 μm in the wavelength of $\lambda$, shown in FIG. 8. A photodiode with a high sensitivity surely forms such a sensitivity curve.

In the system of transmitting signals of light communication by using the 1.3 μm light and the 1.55 μm light, it would be extremely convenient to use a photodiode capable of sensing both the light having different wavelengths of 1.3 μm and 1.55 μm. However, there is an impediment here.

The other impediment exists in the wavelength division multiplexer.

The wavelength division multiplexer cannot separate light having two different wavelengths at the rate of 1:1. Thus, the separation of light is imperfect. When the outputs are denoted by 1 and 2, $\lambda1:\lambda2=1:\epsilon$ is established at the output 1, and $\lambda1:\lambda2=\epsilon:1$ is established at the output 2. The extinction ratio $\epsilon$ is never zero but is approximately at least 1/100.

Therefore, crosstalk is caused by the sense of unnecessary light caused by reflecting or scattering light, in particular the reflection light of the 1.3 μm light itself, in the connector part and the wavelength division multiplexer. It is a serious fault. Since the wavelength division multiplexer cannot, sufficiently separate the light into two different wavelengths, the dielectric multilayer additionally brings the extinction ratio close to zero. Hence, a filter capable of cutting the 1.3 μm light was required to be inserted between the connector 23 and the wavelength division multiplexer 21 shown in FIG. 5.

A horizontal-type photodiode (waveguide-type), which can sense the light having only one wavelength, has been proposed. In this photodiode, the light having other wavelengths is shut out by the waveguide. This has been developed for detecting only the counter part of light separated by a wavelength division multiplexer. Masahito Shishikura, Yoshihisa Tanaka, Hiroshi Matsuda, Hitoshi Nakamura, Takao Miyazaki and Shinji Tsuji, published an article entitled "Wide tolerance waveguide-type PIN photodiode" which can be found in the General meeting of Electronics Information Communication Seminars, C-386 p386 (1995).

They describe a photodiode for sensing only 1.3 μm light when the light including the wavelengths of 1.3 μm and 1.55 μm enters a waveguide in parallel with the surface. The paper says that the sensitivity ratio of 1.3 μm to 1.55 μm is 23 dB (200 times) when a proper bias-voltage is supplied. This invention aims at developing a photodiode used for sensing only 1.3 μm light after 1.3 μm and 1.55 μm have been separated by a wavelength division multiplexer. Of course, the wavelength division multiplexer is indispensable for separating light. This photodiode is, however, suitable for taking out only 1.3 μm light, but can not be used for 1.55 μm light which is the object of the present invention.

A conventional photodiode module has three main parts, that is, a wavelength division multiplexer, a filter and a photodiode (light receiving device). The photodiode module combining many costs a lot to produce. This is a fatal demerit for a transmitting and receiving device of bilateral light communication.

SUMMARY OF THE INVENTION

It is an object of the present invention to provide a photodiode module having fewer parts than known photodiode modules.

Another object of the present invention is to provide a small-sized photodiode module that costs less to produce than known photodiode modules.

A further object of the present invention is to provide a photodiode module suitable for a long-distance communication.

A still further object of the present invention is to provide a low cost photodiode module that has a low optical loss for practical uses for subscribers.

The Inventors considered why a conventional optical photodiode module are expensive and large.

The ordinary light receiving device used a photodiode capable of sensing light having different wavelengths, that is, a wavelength common-type photodiode. Such a photodiode is likely to be convenient in sensing light with different wavelengths. This matter is, however, a problem. Since the wavelength common-type photodiode has the sensitivity for light having different wavelengths, signal light must have been spatially separated prior to taking out specific light. A wavelength division multiplexer and a dielectric multi-layer were indispensable for the spatial separation. Each intensity of light having different wavelengths is detected by the steps of separating the light having different wavelengths spatially, leading the light to different optical paths and providing a commontype photodiode at each terminal point of the different paths.

The present invention does not use the sensitivity common-type photodiode but uses a photodiode for sensing light having only one wavelength, that is, a sensitivity intrinsic-type photodiode. An intrinsic photodiode Dj is used for sensing only an object wavelength of $\lambda$ j. The dielectric multi-layer is not used here. This photodiode has the function of the wavelength division multiplexer. Therefore, any wavelength division multiplexer is not necessary. The invention is provided by deep consideration pertaining to the physics of a semiconductor photodiode. It is feasible for a semiconductor photodiode to sense only a specific wavelength.

The wavelength-dependency of sensitivity of the semiconductor photodiode was explained by FIG. 8. This point is very important for the present invention, so that a more detailed explanation will be provided. The relation between the energy of the incident light and the band structure of semiconductor will be explained by referring to FIG. 22. The energy on the bottom side of a conduction band is denoted by Ec, and the energy at the top of valence band is denoted by Ev. The difference between Ec and Ev is a bandgap, that is, Eg=Ec−Ev. The interval between the conduction band and the valence band is a forbidden band.

When there is no impurity in the semiconductor, the forbidden band has no level. The conduction band has a few electrons but the valence band is condensed with electrons. Holes correspond to a lack of electrons in the valence band. The density of electrons in the conduction band and the density of holes of the valence band are zero at 0K (Kelvin). When there is no impurity level, a Fermi level is positioned at the middle height of the forbidden band. The electrons in the conduction band and the holes in the valence band are a little excited by heat in a definite temperature.

When a photon enters the valence band, a electron in the valence band is excited into the conduction band, which is shown by "a" in FIG. 22. This phenomenon is called "excitation of electron-hole". This phenomenon takes place only when the energy of light is higher than the bandgap. Hence, an inequality h ν≧Eg is satisfied. If a semiconductor has a sufficient thickness, all of the light having higher energy than the bandgap is absorbed. In other words, all light having a wavelength λ shorter than a wavelength λg (=hc/Eg) of the absorption edge is absorbed, that is, λ<λg.

On the contrary, when the light having a smaller energy than the bandgap enters the valence band, the energy is insufficient, as shown by arrows "b" and "c". Since there is no electron level in the forbidden band, the transitions shown by arrows b and c do not occur. Hence, a photon having smaller energy than the bandgap (h ν<Eg) passes through the semiconductor as it is. The semiconductor is transparent to the light having lower energy than Eg. Hence, the light having a wavelength longer than the wavelength λg on the absorbing edge can pass through the semiconductor.

The above explanation pertains to the case of intrinsic semiconductors in which there is no electron level in the forbidden band. However, even if the semiconductor is n-type or p-type, shallow impurity levels En and Ep are mostly generated. This will be explained by referring to FIG. 23.

In this case, the limit of energy for causing the transition is (Eg−En) or (Eg−Ep). These levels En and Ep are from a several hundredth to a tenth of the bandgap. Therefore, the electron level scarcely occurs in the forbidden band, even when a semiconductor is n-type or p-type, but a little deviation of the absorbing edge occurs.

The impurity making a deep level such like Es in FIG. 23 is not doped for controlling the conductivity. The epitaxial layer with a good quality does not have such a deep impurity level. When a semiconductor is n-type or p-type, the limit of photon energy absorbed is (Eg−En) or (Eg−Ep) instead of the bandgap of Eg. However, there is not a large difference therebetween, the absorption energy is briefly represented by the bandgap Eg.

In any case, photons having a higher energy h ν than the bandgap Eg, that is, E≧Eg λ<λg, are absorbed in the semiconductor but photons having a lower energy than the bandgap (E<Eg:λ>λg) pass through. Hence, the semiconductor has the selectivity of wavelength by itself. Until now, there have been no devices utilizing semiconductors by themselves as wavelength selective devices. The Inventors utilize the wavelength-selectivity of semiconductors, and propose for a first time a device making use of the wavelength-selectivity selectivety of semiconductors. The present invention will be explained by describing in detail various presently preferred embodiments of the invention.

This invention proposes a photodiode having the function of filter by itself. Therefore, this invention provides a module enjoying a cheaper cost and easier handling as a light receiving device for transmitting two sorts of light having different wavelengths due to the filter function. A wavelength division multiplexer is used in the two-wavelength transmission system, but a dielectric filter for complementing the loss of extinction ratio is unnecessary. The above-mentioned is related to two wavelengths of λ1 (=1.3 μm) and λ2 (=1.55 μm), that is, (a) is the combination of the 1.3 μm light and 1.55 μm light. This invention can be adopted in any combination of two wavelengths. Other realizable examples of combining two wavelengths are as follows.

b) Combination of 0.98 μm and 1.3 μm
c) Combination of 1.3 μm and 1.65 μm
d) Combination of 1.55 μm and 1.65 μm This invention is utilized for GaAs-type photodiodes of shorter wavelengths besides InP-type photodiode for long wavelengths.

The filter layer having a band gap wavelength λg satisfying λ1<λg<λ2 absorbs λ1 and admits λ2 to pass through. The PD itself has the wavelength selectivity. The filter layer saves the cost of the optical communication by eliminating WDMs. The n-electrode spanning both p- and n- regions cancels the delayed pairs of electrons and holes generated by the stray light at the periphery. The disappearance of the delayed current enhances the tolerance of mounting optical parts and PDs. Since both n- and p- electrodes appear on the top, the PD is suitable for the top surface installment.

DETAILED DESCRIPTION OF THE PREFERRED EMBODIMENTS

Figure 1:
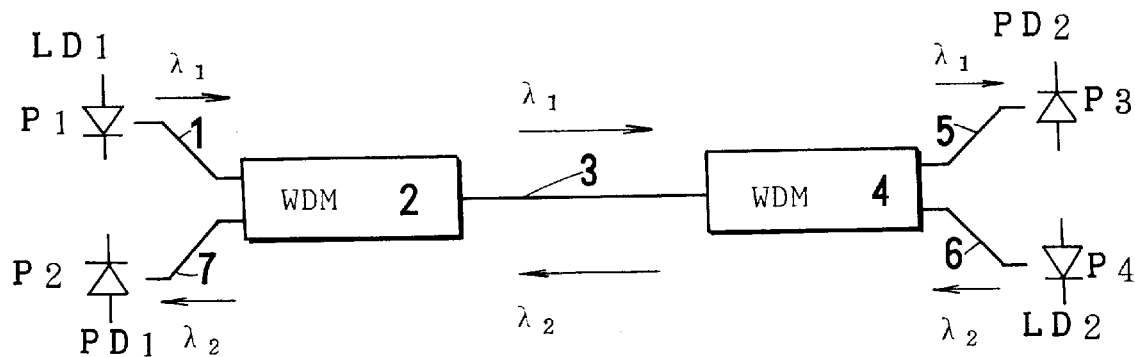
FIG. 1 is an explanatory schematic figure of the multi wavelength bilateral communication.
Figure 2:
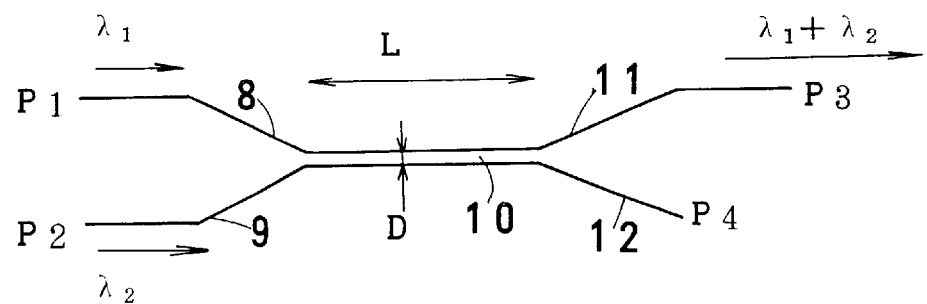
FIG. 2 is an explanatory figure of a wavelength division multiplexer capable of coupling the light having a wavelength of λ1 with the light having a wavelength of λ2 and leading the coupling light (λ1+λ2) into one optical fiber.
Figure 3:
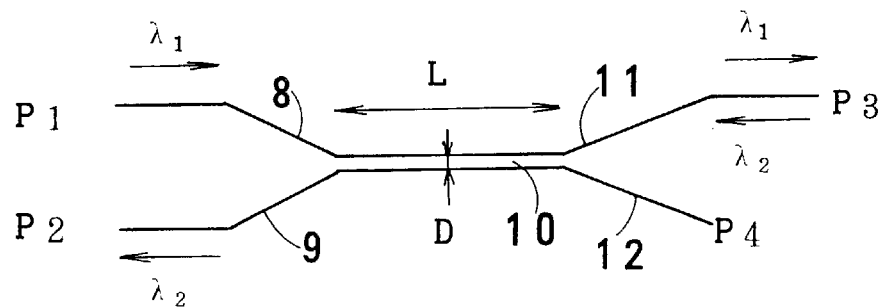
FIG. 3 is an explanatory figure of a wavelength division multiplexer capable of leading the light having a wavelength of λ1 from one end and leading the light having a wavelength of λ2 from the opposite end and taking out the λ1 light from the same optical fiber and the λ2 light from the different optical fiber.
Figure 4:
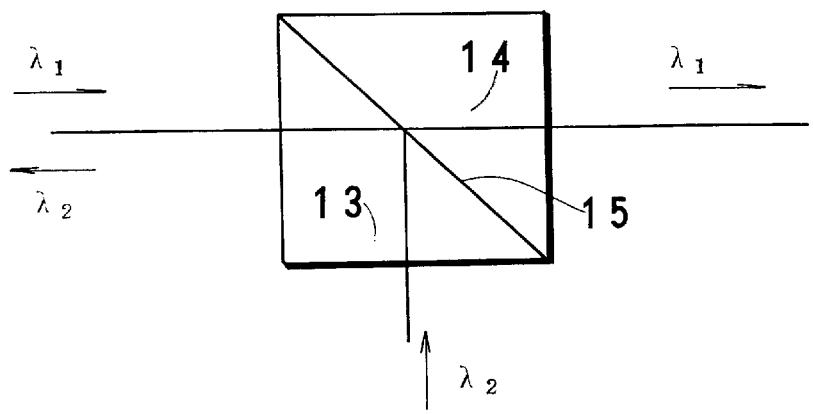
FIG. 4 is an explanatory figure of a wavelength division multiplexer utilizing a multi-layer mirror.
Figure 5:
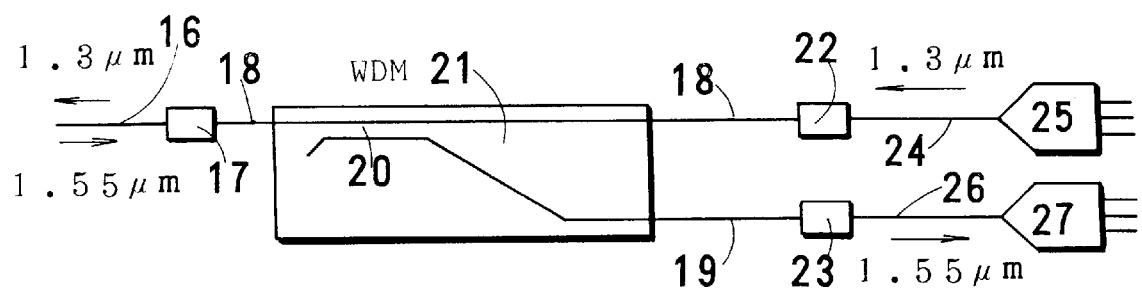
FIG. 5 is a structural figure of a conventional PD/LD module on the side of subscriber.
Figure 6:
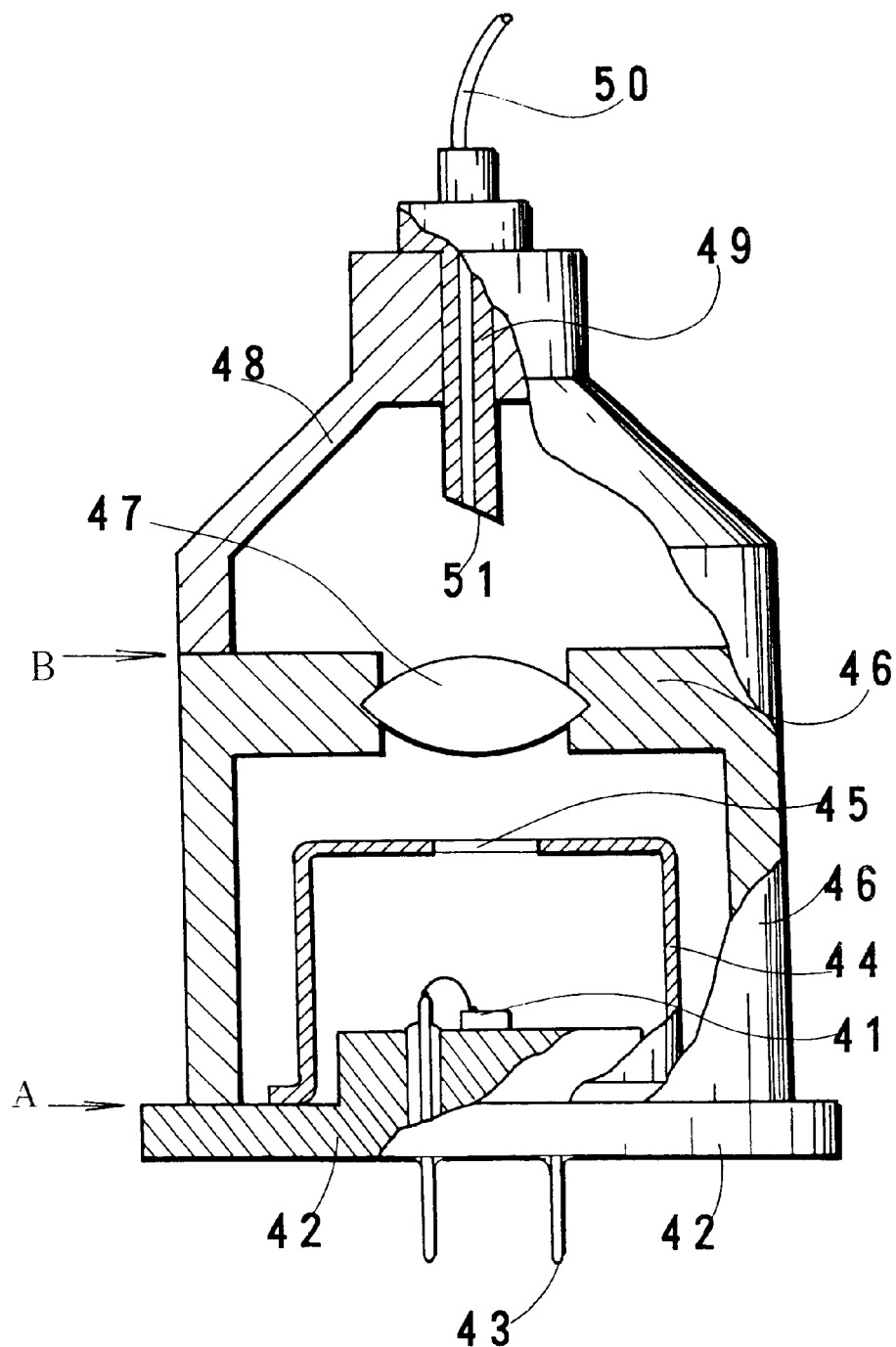
FIG. 6 is a sectional front view of a conventional semiconductor photodiode.
Figure 7:
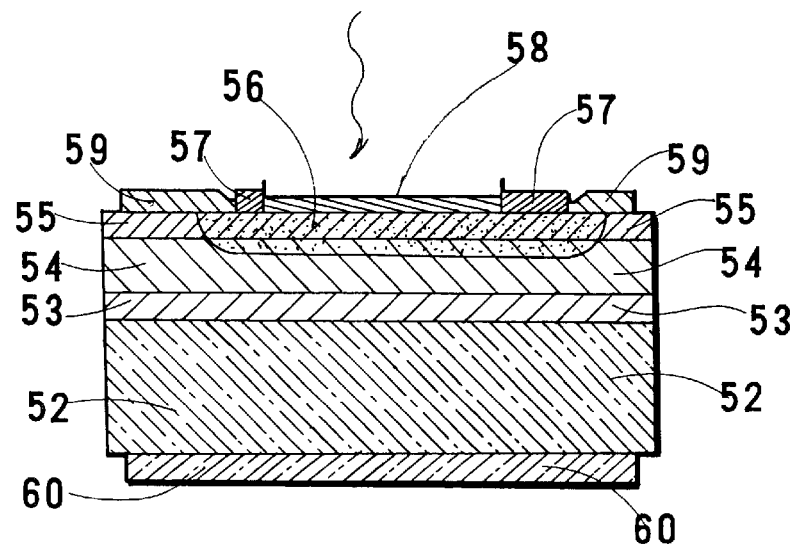
FIG. 7 is a sectional front view of a conventional photodiode chip.
Figure 8:
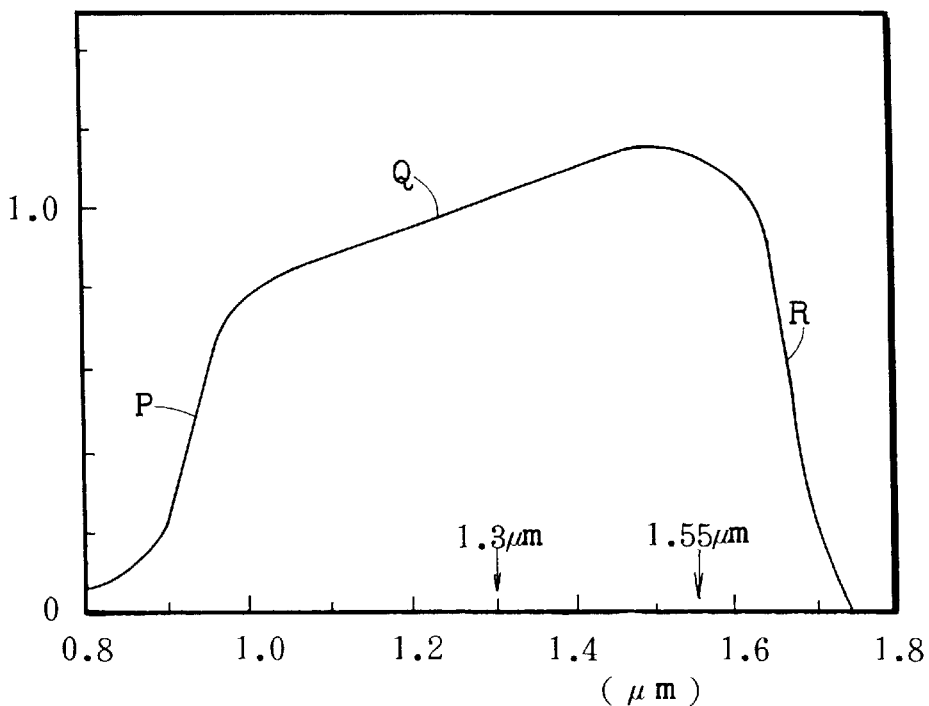
FIG. 8 is a graph showing the property of sensitivity of a conventional photodiode chip.
Figure 9:
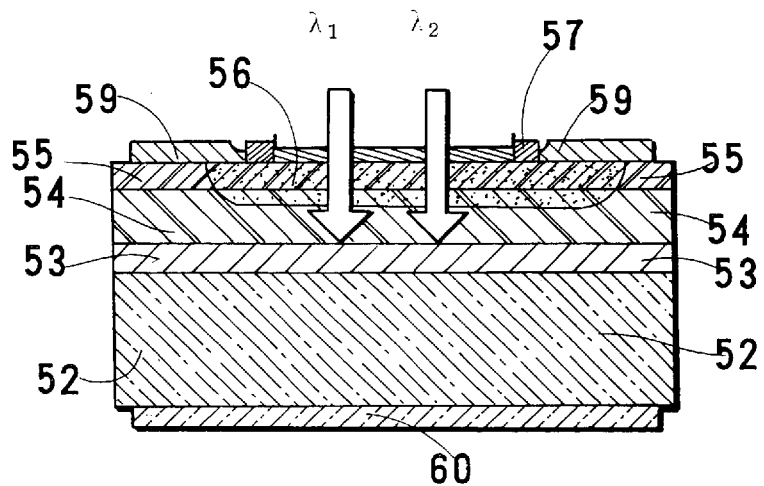
FIG. 9 is a sectional view of a prior PP chip for explaining the generation of photocurrents caused by two kinds of light having different wavelengths of λ1 and λ2 which have reached a light receiving layer when the light having different wavelengths of λ1 and λ2 enters a conventional photodiode.

FIG. 9 is an example of conventional photodiodes having an InGaAs light receiving layer, which is an ordinary photodiode capable of receiving the light having different wavelengths of λ1 and λ2. An n-InP buffer layer 53, an n-InGaAs light receiving layer 54, and an n-InP window layer 55 are deposited on an n-InP substrate 52 in order. The center part of the window layer 55 is converted to a p-type region 56 by Zn-diffusion, and a ring-type p-electrode 57 is positioned on the periphery of the p-type Zn-diffusion layer 56. A passivation layer 59 is formed on the periphery of the InP window layer 55, and protects the ends of a pn-junction. There is an n-electrode 60 on the whole rear surface of the n-InP substrate 52. Any wavelength is available for λ1 and λ2 but λ1=1.3 μm and λ2=1.55 μm are taken up for explaining the embodiments of the present invention as a suitable example. InGaAs, which is a material of the light receiving layer, can absorb and sense two kinds of light having different wavelengths of λ1 and λ2. The bandgap of InP is higher than λ1 or 2 in energy, and the bandgap of InGaAs is smaller than λ1 and λ2 in energy. Therefore, it is infeasible for such a combination to select one of the two wavelengths. Hence, wavelength selectivity is not expected.

However, the present invention provides a photodiode having wavelength-selectivity, for example, a photodiode capable of abandoning λ1 but sensing λ2. To achieve the wavelength-selectivity, it is necessary to incorporate a layer having a bandgap between λ1 and λ2, that is, having the wavelength-selectivity into a PD device.

It is assumed that an InGaAsP layer capable of absorbing the light having a wavelength of λ1 (=1.31 μm) is provided on the incident side of the InGaAs layer. As a result, the InGaAsP layer plays the role of a filter capable of abandoning λ1 and guiding only λ2.

Figure 10:
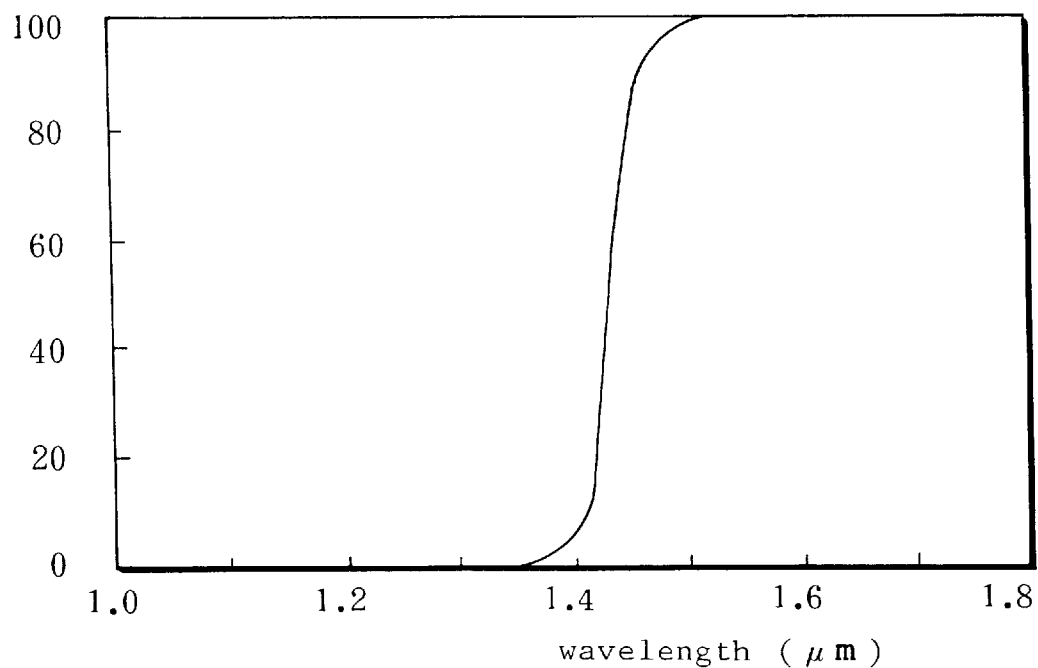
FIG. 10 is a graph for showing the light transmittance (%) of an InGaAsP (λg=1.42 μm) layer, where the abscissa denotes wavelengths (μm) and the ordinate denotes transmittance(%).

If the InGaAsP layer has the transmission property as shown by FIG. 10, it is possible to distinguish λ1 from λ2. This property is brought about by the crystal having a bandgap of 1.42 μm, i.e. λg=1.42 μm. The concrete composition of InGaAsP is shown by the quaternary mixed crystal of $In_{0.66}Ga_{0.34}As_{0.76}P_{0.24}$. This quaternary mixed crystal can absorb 1.3 μm light and can lead 1.55 μm light. Any crystal having a bandgap ranging from 1.3 μm to 1.55 μm instead of 1.42 μm enjoys such a transmission property. If such an InGaAsP mixed crystal is deposited on the light receiving side, the 1.3 μm light will be absorbed and the 1.55 μm light will be led.

It is, however, not so simple in fact. Even if an InGaAsP filter is only formed on the InGaAs light receiving layer, the carriers generated by the 1.3 μm light are mixed with the carriers generated by the 1.55 μm light because there exists an electric field. Therefore, the mixed carriers flow into the electrode, which ends up with sensing the 1.3 μm light. Crosstalk never reduces. The light receiving layer and the filter layer must spatially be separated.

Embodiment ①

An n-type Filter Layer is Formed on the Rear Surface of the Substrate

Figure 11:
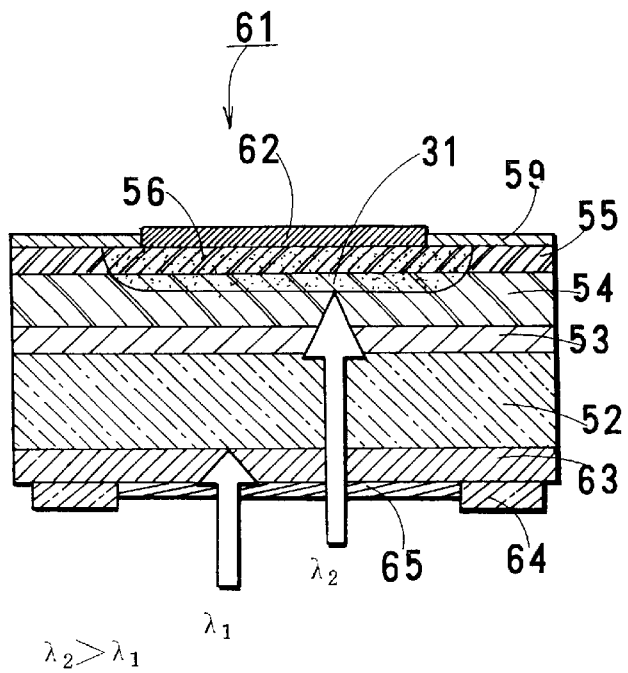
FIG. 11 is a sectional view of a photodiode chip with respect to a first embodiment of the present invention in which an n-InGaAsP filter layer is provided with the rear surface of an n-InP substrate.

A photodiode having the structure shown by FIG. 11 has been conceived by the Inventions after various considerations. A filter capable of abandoning the λ1 light is formed on the opposite side to the light receiving layer regarding the substrate. Hence, an n-type InGaAsP absorbing layer (filter) is formed on the rear surface of the n-InP substrate. Incident light enters from the bottom surface. There is nothing but the n-type InGaAsP filter formed on the rear surface of the n-InP substrate in order to separate the filter spatially from the light receiving layer. The rear surface incident-type is indispensable to exclude unnecessary light by the filter and then to lead necessary light into the light receiving layer.

An n-InP buffer layer 53, an n-InGaAs light receiving layer 54 and an n-InP window layer 55 are epitaxially grown on an n-InP substrate 52 in order, as shown in FIG. 11. This is the same as conventional photodiode chips. Further, in addition, an $n^+$-InGaAsP filter layer 63 ($\lambda$g=1.4 μm) is epitaxially grown on the rear surface of the n-InP substrate 52. This is a conspicuous feature of this invention that such an epitaxial filter layer is formed on the rear surface of the substrate. No problem occurs when the order of epitaxial growth on both upper and rear surfaces is reversed.

Hence, this InP wafer is epitaxial in both surfaces. A p-region 56 is formed on the upper surface of the substrate by masking and Zn-diffusing as well as ordinary photodiodes. A pn-junction 31 is formed in the InGaAs light receiving layer 54. A p-electrode 62 is fitted on the p-region 56. The p-electrode includes not only a ring-type but also a board-type, because light does not enter from the p-side. The periphery of the p-electrode 62 is covered with a passivation layer 59.

A ring-type n-electrode 64 is formed on the bottom surface of the $n^+$-InGaAsP filter layer 63. An antireflection layer 65 coats the center part of the $n^+$-InGaAsP filter layer 63. Here, the composition of the filter layer is shown as $In_{0.66}Ga_{0.34}As_{0.76}P_{0.24}$, but the suffixes are omitted for simplicity.

The λ1 light and the λ2 light enter the chip from the bottom surface. Since the wavelength λ1 (1.3 μm) is shorter than the bandgap ($\lambda$g=1.42 μm) of the filter layer 63, the λ1 light is absorbed by the filter layer 63. The carriers are generated in the filter layer 63 by λ light but do not reach the electrode, are recombined and vanish. On the contrary, since the wavelength λ2 is longer than the bandgap of the filter layer 63, the λ2 light passes through the filter layer 63, as shown in FIG. 10. Only the wavelength λ2 (=1.55 μm) reaches the n-InGaAs light receiving layer 54. Therefore, the photodiode senses only the 1.55 μm light, which means the photodiode enjoys the wavelength selectivity.

Since the n-type filter is grown on the n-type substrate, no pn-junction is formed in FIG. 11. A positive voltage is applied to the n-electrode 64, and a negative voltage is applied to the p-electrode 62, so that no electric field exist in the filter layer 63, the substrate 52, buffer layer 53 and so on. A voltage is applied to the pn-junction 31. There generates a depletion layer having a thickness corresponding to the voltages. The incident λ1 light from the bottom surface is perfectly absorbed in the filter layer, which results in the formation of electron-hole pairs. The carriers hardly move without an electric field. Although the carriers are diffused by the gradient of concentration, the speed of carriers is not worth serious consideration. Since there are a lot of electrons in the n-type layer and also around the n-type layer, there are no problems. The holes move slowly by diffusion because there is no electric field, so that the holes are combined with electrons existing around the filter layer again and vanish. Hence, these holes are combined with electrons again before reaching the electrode, and are quenched to become heat. Therefore, the 1.3 μm light perfectly dissappears without becoming photocurrent.

Since the 1.55 μm light is not absorbed by the n-type InGaAsP filter layer, it reaches the light receiving layer near the upper surface of the chip and then is absorbed in the light receiving layer, which brings about the generation of electron-hole pairs. Since there occurs a strong electric field near the pn-junction, electrons run to the n-electrode and holes run to the p-electrode, respectively. These electrons and holes become photocurrent, respectively. Hence, the n-type InGaAsP layer formed on the bottom surface of the n-InP substrate works as a filter having the function of shutting out the 1.3 μm wavelength and leading the 1.55 μm wavelength. The rear surface incident-type InGaAs photodiode having the InGaAsP filter layer plays the role of a light detector with the selectivity insensitive to the 1.3 μm wavelength and sensitive to the 1.55 μm wavelength.

Embodiment ②

Rear Surface p-type Filter Layer is Provided

As mentioned above, Embodiment ① is provided with the n-type InGaAsP filter layer on the bottom surface of the n-type substrate. Some electrons generated in the filter layer reach the n-side electrode and the corresponding holes are combined with other electrons again. As a result, a small amount of photocurrent eventually flows. It is preferable that the carriers (electrons and holes) generated by the light in the filter should be rapidly recombined with, respectively and should be extinct.

Figure 12:
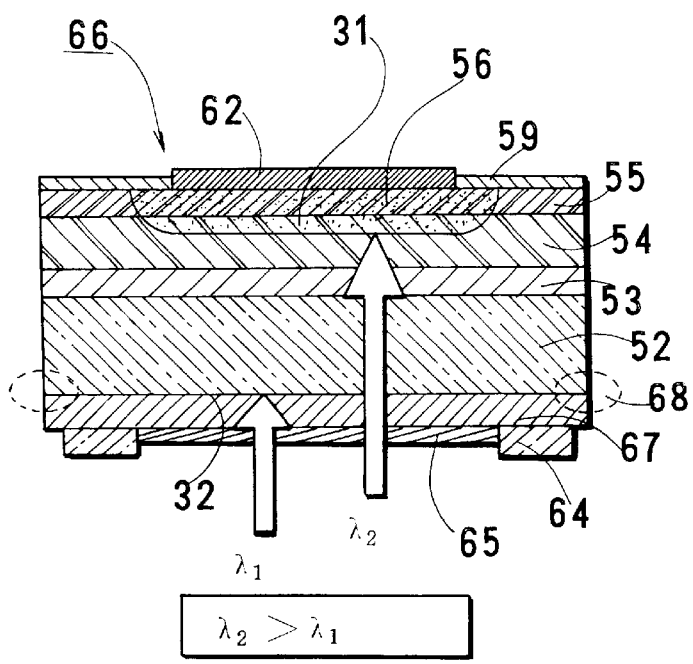
FIG. 12 is a sectional view of a photodiode chip with respect to a second embodiment of the present invention in which a p-InGaAsP filter layer is provided with the rear surface of an n-InP substrate.

To realize the above requirement, the pn-junction should be positioned in the vicinity of the filter layer and the electric field should be applied to the pn-junction. FIG. 12 shows a photodiode chip improved for the above requirement. The photodiode shown by FIG. 12 does not have an n-type but a p-type InGaAsP filter layer formed on the bottom surface of the n-type InP substrate.

An n-InP buffer layer 53, an n-InGaAs light receiving layer 54, and an n-InP window layer 55 are epitaxially grown on an n-InP substrate 52 in order. This is the same as the conventional photodiode chips. Further, in addition to these layers, a $p^+$-InGaAsP filter layer 67 (bandgap: $\lambda$g=1.4 μm) is epitaxially grown on the rear surface of the n-InP substrate 52. In Embodiment ①, an n-type InGaAsP works as a filter but in this embodiment, a p-type InGaAsP works as a filter. The InP wafer of this embodiment is an epitaxial wafer having epitaxial upper and bottom surfaces as well as Embodiment ①.

A p-region 56 is formed on the upper surface of a wafer by Zn-diffusion through a mask as well as ordinary photodiodes. As a result, a pn-junction 31 occurs. A p-electrode 62 is fitted on the p-region 56 that is not ring-type but board-type as same as Embodiment ⓪. Light does not enter the chip from the p-side. The periphery of the p-electrode 62 is covered with a passivation layer 59. The ends of the pn-junction 31 are coated with the passivation layer 59.

A ring-type n-electrode 64 is formed on the bottom surface of the p$^+$-InGaAsP filter layer 67 on the bottom side. Since the n-electrode 64 contacts with the p-type material, the electrode material should be the same as a material for the p-electrode. The n-electrode 64 shown in FIG. 12 differs from ones shown in FIG. 11 and FIG. 14. An antireflection layer 65 coats the middle parts of the p$^+$-InGaAs filter layer 67.

A new pn-junction 32 is generated between the p-InGaAsP filter layer and the n-InP substrate. Hence, dual pn-junctions 31 and 32 are made. Since the pn-junction 32 between the p$^+$-InGaAs filter layer 67 and the n$^+$-InP substrate 52 is forward biased, the electric field is mostly applied to the pn-junction 31 on the light receiving layer side.

The downward pn-junction 32 is cropped out on the side surface of the chip. Since the pn-junction is not coated with the passivation layer, leakage current flows. This leakage current short-circuits the pn-junction. The 1.3 µm light generates photocarriers in the InGaAsP filter layer. Since the voltage in the pn-junction goes down naturally, holes flow toward the n-InP substrate, and are recombined with electrons. The electrons are combined with holes being as the majority carriers in the p-InGaAsP filter layer. The carriers generated by the 1.3 µm light have no ability to flow current.

Figure 13:
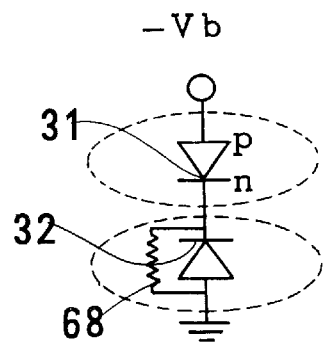
FIG. 13 is an equivalent circuit of the photodiode chip shown by FIG. 12.

FIG. 13 is an equivalent circuit of the photodiode shown by FIG. 12. The pn-junction 31 of the light receiving layer is connected to the pn-junction 32 of the filter layer in series. The pn-junction 31 of the light receiving layer is reverse-biased, and the pn-junction of the filter layer is forward-biased. A resistance 68 is shown so as to be equivalent to the operation of flowing electric charge by the exposed part 68 of the pn-junction. The photocurrent by the 1.55 µm light flows passing through the pn-junction 32 and the resistance 68.

Embodiment ③ pn-junction is Short-circuited

Figure 14:
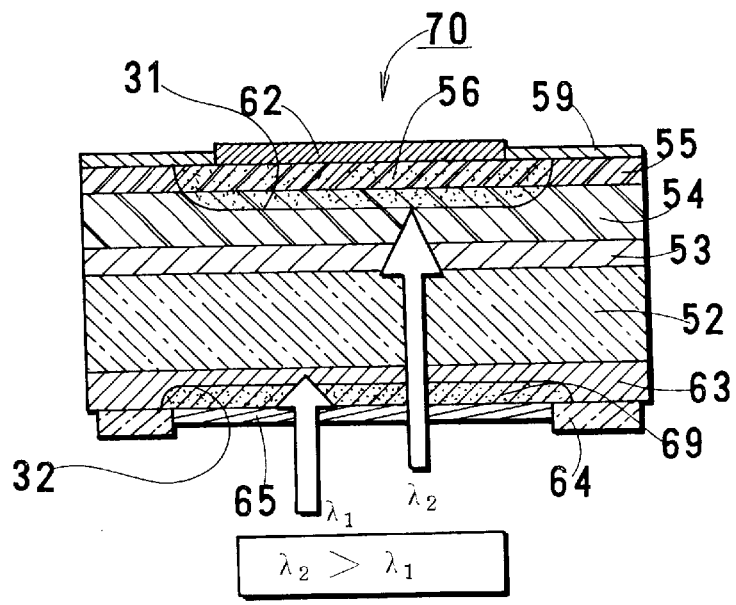
FIG. 14 is a sectional view of a photodiode chip with respect to a third embodiment of the present invention in which an n-InGaAsP filter layer is provided with the rear surface of an n-InP substrate and then a pn-junction is formed in the n-InGaAsP filter layer by Zn-diffusion.

In Embodiment ②, the pn-junction formed in the filter layer is actually short-circuited by its exposure. More positive short-circuit is feasible for the pn-junction 32 of the filter layer. If so, unnecessary carriers generated by the 1.3 µm light can be quenched faster. However, the short-circuit is impossible because of the pn-junction exposed out to the side surface of the chip. Therefore, the pn-junction should be exposed to the rear surface of the substrate. The exposed pn-junction is short-circuited by a metal electrode. Such a photodiode 70 is shown by FIG. 14.

An n-InP buffer layer 53, an n-InGaAs light receiving layer 54, and an n-InP window layer 55 are epitaxially grown in order on an n-InP substrate 52. Further, an n$^+$-InGaAsP filter layer 63 (λg=1.4 µm) is epitaxially grown on the bottom surface of the substrate 52. Hence, this InP wafer is an epitaxial wafer having epitaxial upper and bottom surfaces. In this embodiment, the n-type InGaAsP is formed on the rear surface of the substrate, which is similar to Embodiment ① but is different from Embodiment ②.

A p-region 56 is formed on the upper surface of the chip by masking and Zn-diffusing as well as ordinary photodiodes. A pn-junction 31 is formed in the light receiving layer 54. A p-electrode 62 is fitted on the p-region 56. This p-electrode is not ring-type but board-type as well as the above Embodiments, because light does not enter the chip from the p-side. The periphery of the p-electrode 62 is covered with a passivation layer 59. The n$^+$-InGaAsP filter layer 63 formed on the bottom surface of the substrate is further masked and Zn-diffusion is carried out thereon.

A p-InGaAsP part 69 is formed by Zn-diffusion in the center part of the filter layer 63. This p-region 69 is a p-region not of InP but of InGaAsP. Further, the p-region 69 is larger than the upper p-region 56 in area. A pn-junction 32 is generated inside the InGaAsP layer 63. A ring-type n- and short-circuit electrode 64 is formed on both the n-InGaAsP 63 and the p-InGaAsP 69 including the end of the pn-junction.

The n-electrode 64 in Embodiment ③ is made from the same material as the n-electrode in Embodiment ①. The n-electrode stretches over the n-region and the p-region, which plays a positive role of short-circuiting the pn-junction. Of course, the n-electrode operates as an n-electrode. The p-InGaAsP 69 is coated with an antireflection layer 65.

Figure 15:
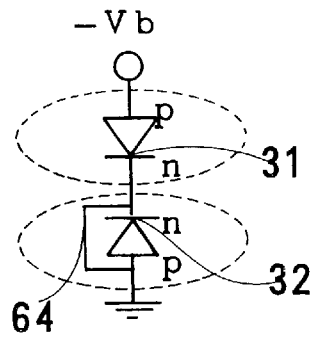
FIG. 15 is an equivalent circuit of the photodiode chip shown by FIG. 14.

The light having different wavelengths of λ1 and λ2 enters from the rear surface. The λ1 (1.3 µm) light is absorbed in the p- and n-InGaAsP layers 69 and 63, and thereby carriers are generated. Since the pn-junction is forward biased, the electric field is weak and the activity of carriers is so slow at the pn-junction. The holes enter the n-region to become minority carriers. The electrons enter the p-region to become minority carriers. The minority carriers move so slow in speed that they collide with the majority carriers and are recombined therewith. FIG. 15 is an equivalent circuit of the photodiode shown by FIG. 14. FIG. 15 shows that the pn-junction 32 is short-circuited by the electrode 64.

Embodiment ④

Photodiode Having a PD Chip Sealed in a Metal Package

Figure 16:
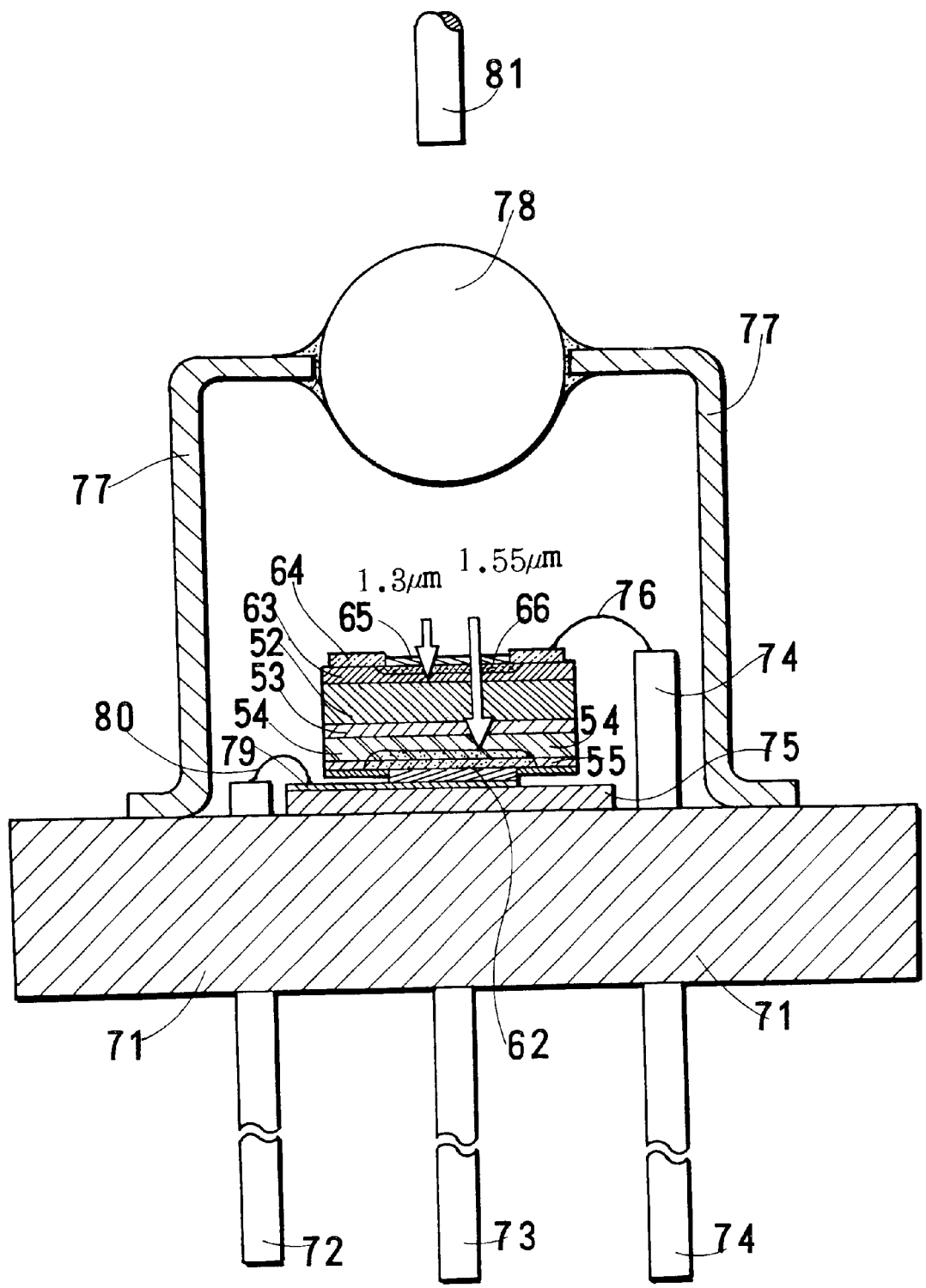
FIG. 16 is a sectional view of a photodiode sealed in a cylindrical package in which the chip shown by FIG. 14 is fitted upside down on a submount.

The Embodiment ④ in which a photodiode chip is mounted in a metal package will be explained by referring to FIG. 16. Since the light enters from the bottom surface, any one of the photodiode 61 in FIG. 11, the photodiode 66 in FIG. 12 and the photodiode 70 in FIG. 14 is laid upside down and is mounted in a package. Here, the photodiode 70 is adopted.

A stem 71 made from a metal, for example, Kovar, is provided with an anode pin 72, a case pin 73 and a cathode pin 74. The upper and bottom surfaces of a submount 75 made from an insulator, e.g. alumina, are metallized. The bottom surface of the submount 75 is soldered to the stem 71. A p-electrode 62 of the PD chip is soldered to the submount 75. The chip is positioned just in the middle of the stem 71. A metallized pattern 79 of the submount 75 is connected to the anode pin 72 with a wire 80. Hence, the p-electrode 62 is connected to the anode pin 72.

Since the chip is upside down, the chip is composed of a p-region 56, an InP window layer 55, an InGaAs light receiving layer 54, an InP buffer layer 53, an InP substrate 52, an InGaAsP filter layer 63 and a p-region 66 from the bottom to the top in order. An antireflection layer 65 of the p-region 56 is an upward surface, which becomes an incident surface of light. An n-electrode 64 (cathode) placed on the filter layer is connected to the cathode pin with a wire 76. A cap 77 equipped with a lens 78 is welded to the stem after the lens has been aligned. An optical fiber 81 is provided outside of the focusing lens 78. Since a negative voltage is applied to the anode (p-electrode 62), and a positive voltage is applied to the cathode (n-electrode 64), a strong voltage is induced to the pn-junction 31 placed downward.

Two sorts of light having different wavelengths of 1.3 μm and 1.55 μm go out of the optical fiber 81, are focused by the lens and enter the PD chip. The 1.3 μm light is perfectly absorbed by the upper InGaAsP filter 63. Since the 1.55 μm light has a smaller energy than the bandgap of the InGaAsP filter, the 1.55 μm light passes through the InGaAsP filter and reaches the downward pn-junction 31, whereby pairs of electron-hole are born. Since there exists a strong electric field in the pn-junction, electrons drifts rapidly to the n-electrode 64 (cathode) and holes drift rapidly to the p-electrode 62 (anode). The drift of electrons and holes makes a current flowing around circuits. Hence, photocurrent flows. The photocurrent flows only by the incidence of the 1.55 μm light. The 1.3 μm light generates no photocurrent because the 1.3 μm light has been absorbed by the filter. It is said that this photodiode has the wavelength selectivity sensitive to only the 1.55 μm light. The photodiode endowed with the wavelength selectivity does not require optical paths to be spatially separated.

Embodiment ⑤

Figure 17:
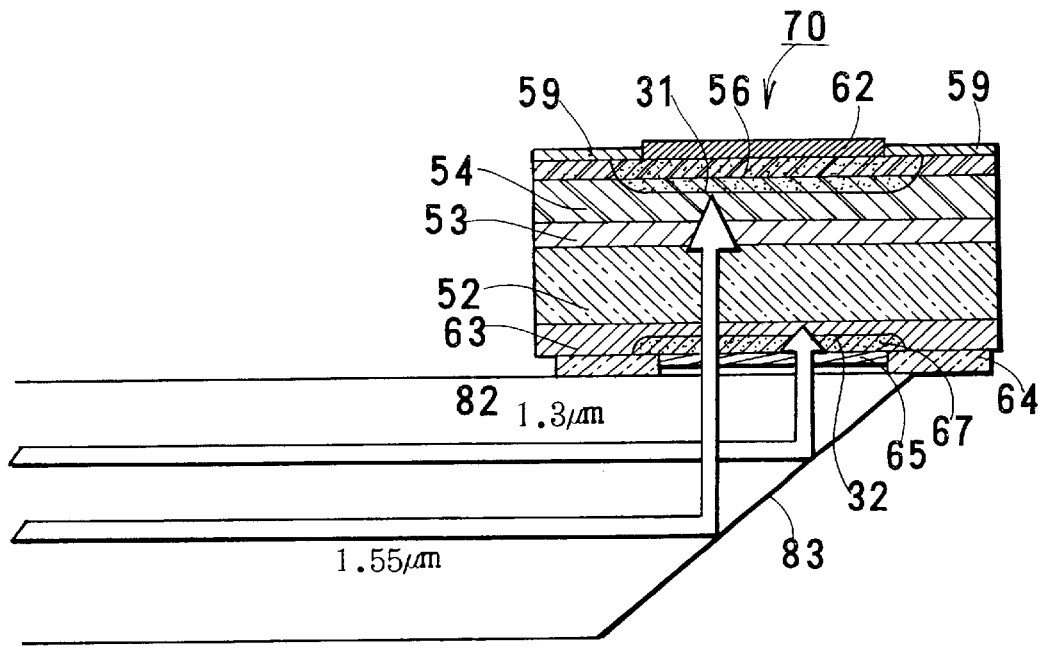
FIG. 17 is a sectional view for explaining the relationship between the chip shown by FIG. 14 and a transmission medium, e.g. an optical waveguide, an optical guide, an optical fiber and so on having a slanting edge, in which the chip is directly fitted on the side surface of the medium, and the light propagating through these optical medium is detected by the PD (photodiode) chip.

Photodiode Unifying an Optical Waveguide, an Optical Guide and an Optical Fiber A photodiode can directly connect to an end part of the optical media, for example, an optical fiber, an optical waveguide, an optical guide and so on. Such a direct connection enjoys an advantage of eliminating lens and of simplifying of package depending on the situation. Further, the alignment is simplified thereby. FIG. 17 explains the connection between the chip and the optical media for guiding light. An end 82 of an optical waveguide, an optical guide or an optical fiber are slantingly cut. Since the light is reflected in the slanting-cut-part 83, the direction of light going out of a core of the optical fiber is changed, that is, the light is launched from the medium in the side direction.

When the cut-angle is 45°, the light goes out in the direction vertical to the side surfaces of the media. Therefore, the PD chip of the present invention is fixed on the top surfaces of the media top side down. Since this PD is a rear surface incident type, it is extremely convenient to fix the rear surface side to the media. The InGaAsP filter 63 placed at the lowest position absorbs only the 1.3 μm light, so that the 1.3 μm light never arrives at the InGaAs light receiving layer 54 and the pn-junction 31. Only the 1.55 μm light reaches the pn-junction 31 and generates photocurrent.

This embodiment provides a compact-type photodiode fixed to the end parts of media which is capable of omitting a lens and a package. This form is very convenient for fabricating electric circuits having an amplifier and so forth on the same plane.

Embodiment ⑥

Photodiode Fixing a Chip Sideward and Opposing to an Optical Fiber

Figure 18:
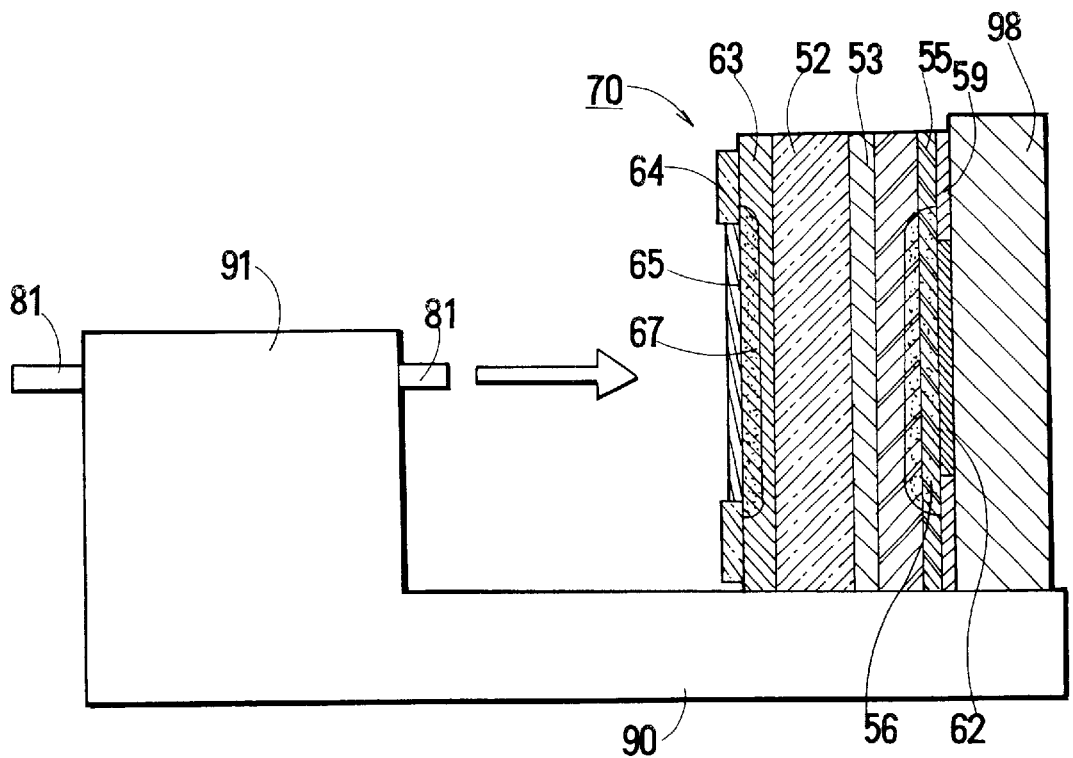
FIG. 18 is a sectional view of a detector in which the photodiode chip of the present invention is fixed at the bottom on a submount as the sides of the submount and the chip have the same plane, is laid on a guide block and fixed thereon, and the end of the optical fiber is fixed by the guide block for sensing the incident light from the optical fiber by the photodiode chip.

A sidewise-type photodiode will be explained by referring to FIG. 18. The chip of the present invention is fixed to the submount 98 with the sides on the same plane, as contacting the p-electrode 62 to the submount 98. The chip is laid sidewise and is fixed on the guide block 90 with the submount 98. The edge of the guide block 90 has a fiber fixing part 91 and an optical fiber 81 is fixed to the fiber fixing part 91. The end of the fiber 81 faces to the rear incident surface of the PD of the present invention. The filter layers 63 and 67 absorb the 1.3 μm light and prevent the 1.3 μm light from invading inward. Only the 1.55 μm light is sensed. Since the chip is vertically positioned, this photodiode can be smaller in size and cheaper than the photodiode shown by FIG. 16. It is certainly suitable to unify a photodiode with electric circuit devices, e.g. amplifiers and so on, on the same plane.

Embodiment ⑦

Assembly of a Photodiode Module

Figure 19:
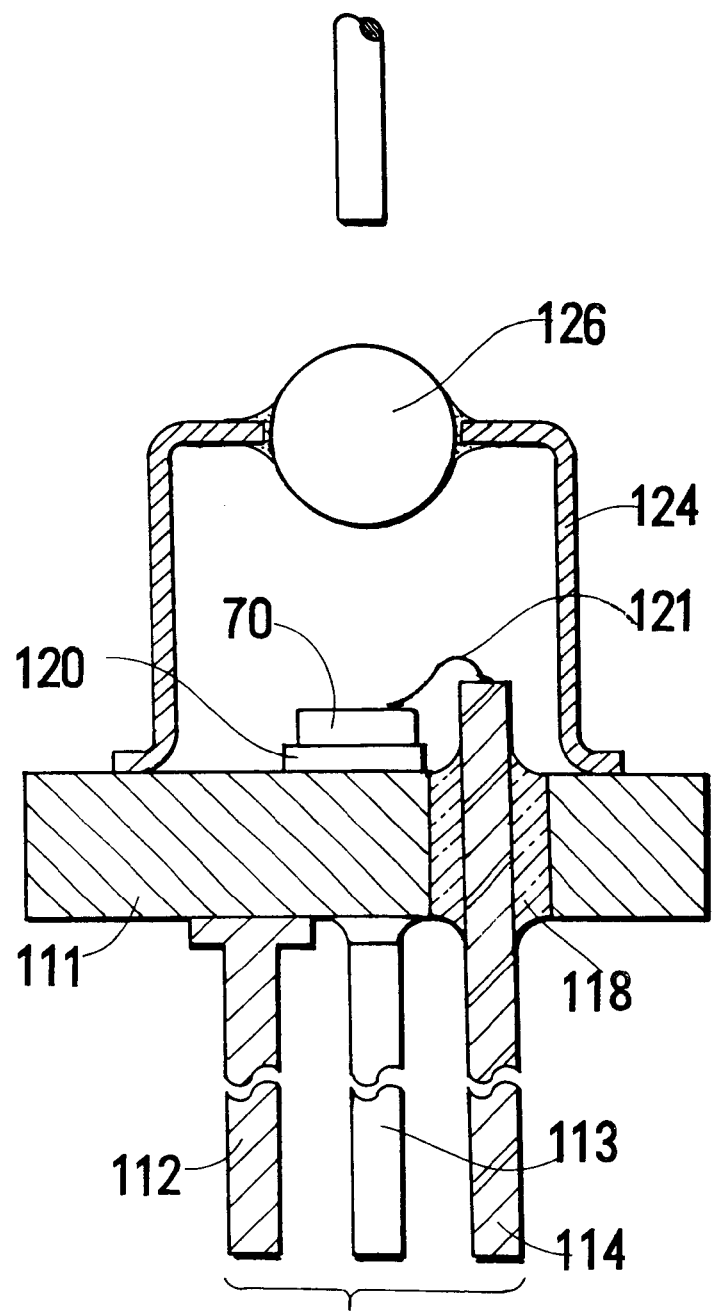
FIG. 19 is a sectional view for showing the packaged photodiode of the present invention in which a rear surface incident-type photodiode of the present invention is installed on a metal stem via a submount, and is covered with a cap equipped with a lens.
Figure 20:
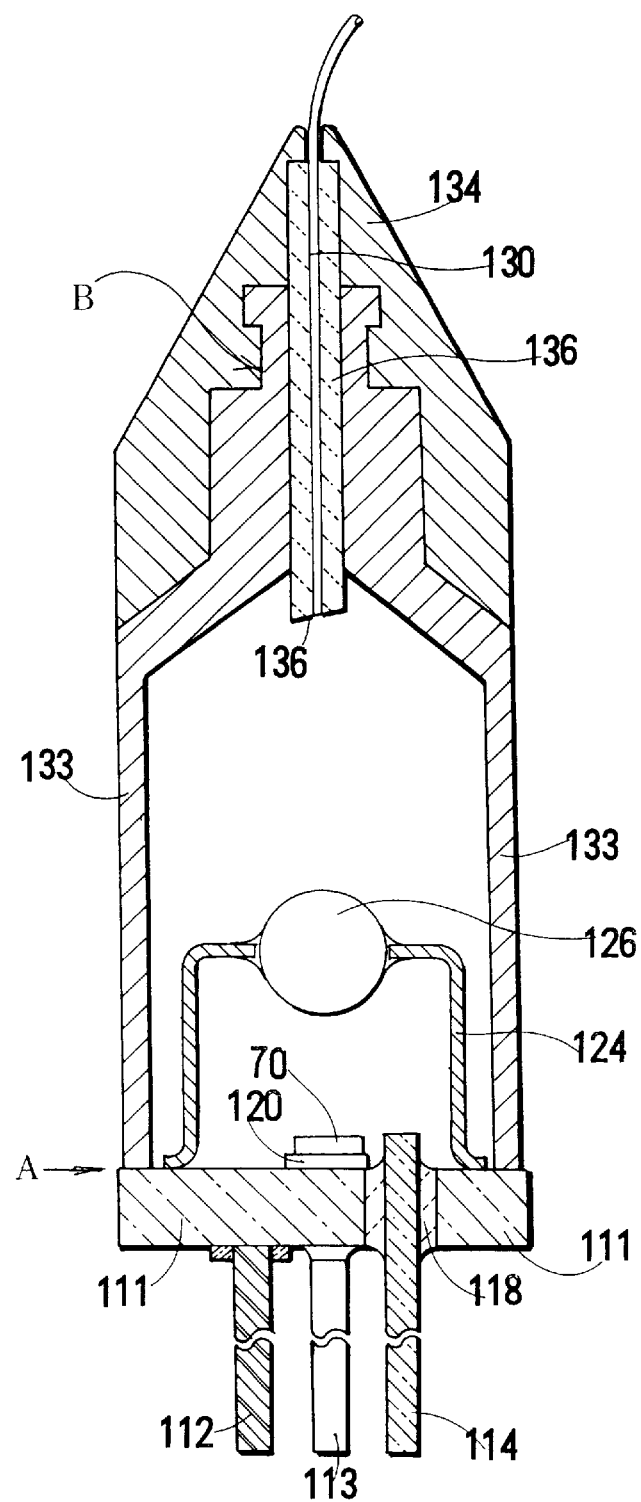
FIG. 20 is a longitudinal sectional view of a pig-tail type photodiode module in which a stem having the rear surface incident-type PD device of the present invention is unified with the optical fiber fixed on a ferrule.

The PD chip of the present invention is also applicable to a pig-tail type photodiode module shown by FIG. 20. To obtain such a photodiode module, the PD chip shown in FIG. 13 is mounted in the package shown in FIG. 19, and further is assembled to be a photodiode module, for example, the photodiode module shown by FIG. 20. The assembly of module will be explained according to the method of producing the chip 70 shown in FIG. 13 and the method of mounting the chip into the package shown in FIG. 19.

The PD chip 70 shown in FIG. 14 is produced by the following steps. The rip buffer layer 53, the n-InGaAs light receiving layer 54 and the n-InP window layer 55 are epitaxially grown on one surface of the n-InP substrate by a Chloride VPE method. Each layer thickness d and each carrier density n are as follows:

n-InP substrate 52: d=350 μm, n=5×10$^{18}$ cm$^{-3}$ n-InP buffer layer 53: d=2 μm, n=2×10$^{15}$ cm$^{-3}$ n-InGaAs light receiving layer 54: d=4 μm, n=1×10$^{15}$ cm$^{-3}$ n-InP window layer 55: d=2 μm, n=2×10$^{15}$ cm$^{-3}$ The n-In$_{0.66}$Ga$_{0.34}$As$_{0.76}$P$_{0.24}$ is epitaxially grown by the Chloride VPE method on the ear surface of the epitaxial wafer, i.e. on a substrate bottom surface. The thickness of the n-InGaAsP filter layer is d=5 μm and the carrier density is n=2×10$^{15}$ cm$^{-3}$. This epitaxial layer grown on the rear side has an absorption coefficient of 1×10$^4$ cm$^{-1}$, i.e. α=1×10$^4$ cm$^{-1}$ to the 1.3 μm light. The reason why the thickness of the n-InGaAsP layer should be 5 μm will be explained.

In this case, transmittance of light is denoted by the following equation.

$$T = \exp(-\alpha d) = 0.007.$$

The transmittance T becomes 0.7%, that is, more than 99% of the light is absorbed by the filter layer having a thickness of 5 μm. The 1.3 μm light is reduced down to less than 1/100 by a wavelength division multiplexer, and further is reduced down to less than 1/100 by the InGaAsP filter. Totally, the 1.3 μm light is decreased down to less than 1/10000, which satisfies an extinction ratio of 40 dB actually required.

A p$^+$-Zn diffusion region 56, an SiNx passivation layer on the n-InP window layer and an AuZn-type p-electrode 62 are formed in accordance with the chip size on the front surface of a bi-epitaxial wafer by using the technologies of both surface mask alignment, photoetching, Zn-diffusion, vacuum evaporation and so on. A p$^+$-Zn-diffusion layer 69, an SiON passivation layer (antireflection layer) 65 and an AuGeNi-type n-electrode 64 are formed on the InGaAsP filter layer on the bottom surface of the bi-epitaxial wafer.

The chip size of the PD is 550 μm×550 μm. The radius of the Zn-diffusion layer (light receiving radius) in the InGaAs light receiving layer 54 is 100 μm. The diameter of an opening part on the InGaAsP filter layer side, that is, an inner diameter of the ring-type n-electrode is 300 μm, which is wider than the diameter (200 μm) of the Zn-diffusion layer in order that the n-electrode never cuts the incident light. Since a lot of PD units are fabricated according to the wafer processes, the wafer is cut lengthwise and breadthwise to be chips. As a result, the PD chip shown by FIG. 14 is produced.

Next, the photodiode shown, for example, by FIG. 19 is made. An alumina-submount 120 having top and bottom metallized surfaces is fixed with an AuSn solder to the center of a stem 111 made from iron (Fe) having three pins 112, 113 and 114. The cathode pin 114 and the anode pin 113 are fixed with an insulating adhesive 118 in holes of the stem. A PD chip 70 is set upside down, and a p-electrode 62 is soldered on the submount 120 with an SnPb solder, whereby the p-electrode 62 is electrically connected to the upper surface of the submount 120. The upper surface of the submount is connected to the anode pin 113 with an Au wire. A ring-type n-electrode 64 faces upward. The ring-type n-electrode 64 is connected to the cathode pin 114 with an Au wire 121 having a diameter of 20 μm.

Further, the PD is cap-sealed in $N_2$ atmosphere. A cap 124 is provided with a ball lens 126 made from BK-7 glass. The production cost is reduced due to the use of a ball lens which dispense with a window glass. It is available to use a cap with a flat window glass and another lens. The PD is made by mounting the PD chip in the package shown in FIG. 19.

Furthermore, the PD module shown by FIG. 20 is made by using the PD shown by FIG. 19. A tip of a single-mode optical fiber 130 is inserted into a ferrule 136 and is fixed thereto. The edge of the fiber 130 is slantingly polished. The ferrule 136 is inserted into a hole of a cylindrical ferrule holder 133 having a narrow top part, made of stainless steel. The diameter of the cylindrical end of the ferrule holder 133 is about the same as that of the stem 111. The stem has three pins 112, 113 and 114. The anode pin 112 and the cathode pin 114 are glued to holes by the insulating adhesive 118. The end surface of the holder 133 is brought in contact with the stem 111, light passes through the optical fiber, and the PD detects the light. The maximum sensitive point is searched by moving the holder on the stem surface, and then A part is welded by a YAG laser.

Next, the most sensitive point is located by moving the ferrule 136 in axial direction to the holder 133. As soon as the maximum sensitive point is found, the ferrule 136 is welded to the holder 133 at position B. Further, a bend-limiter 134 made from rubber covers around the root of the optical fiber to prevent the root of the optical fiber from excessive curving. A pig-tail type photodiode module is made according to the above processes.

The sensitivity of this PD module to the 1.3 μm light and the 1.55 μm light is measured. The reverse-bias of the PD is 5V.

The sensitivity to the 1.3 μm light: less than 0.01 A/W
The sensitivity to the 1.55 μm light: 1.0 A/W The sensitivity to the 1.55 μm light is preferable. The PD module hardly senses the 1.3 μm light. The extinction ratio is less than 1/100. The PD module is excellent in the wavelength-selectivity.

Embodiment ⑧

Receptacle-type Photodiode Module

Figure 21:
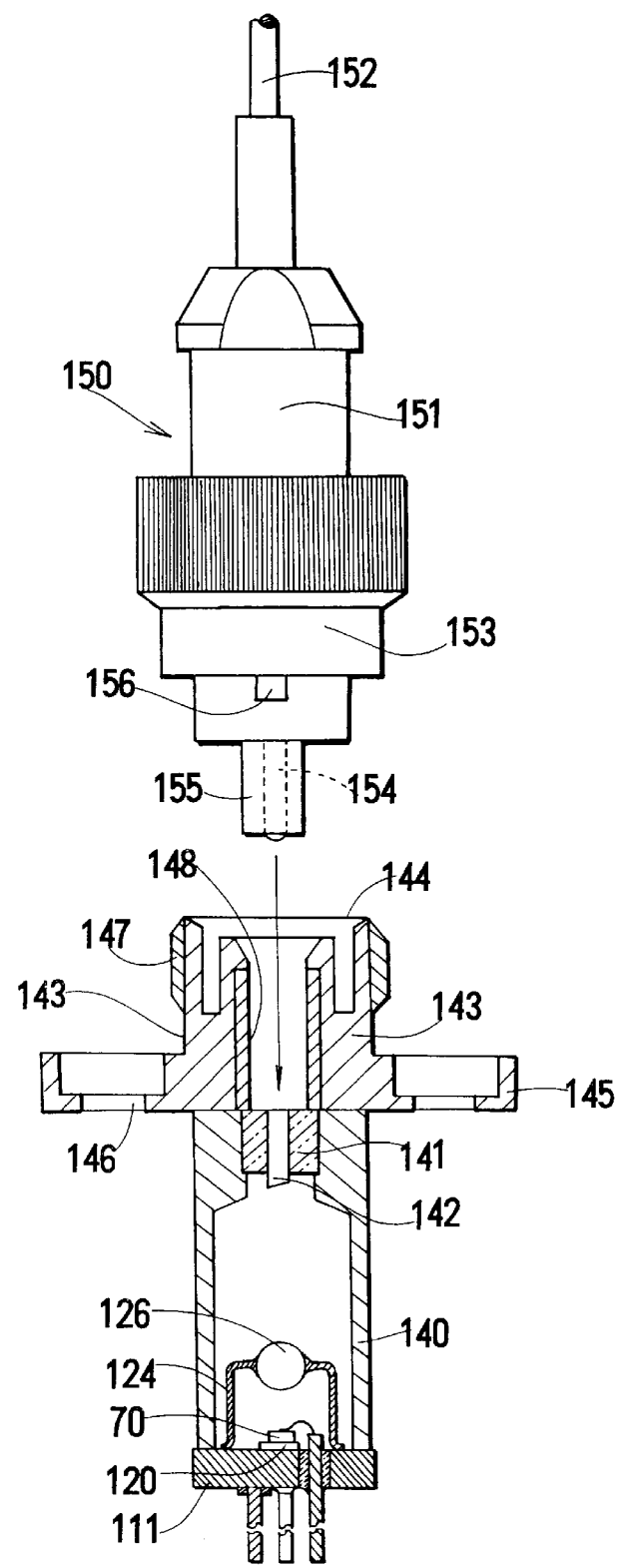
FIG. 21 is a longitudinal sectional view of a receptacle-type module capable of coupling and separating a stem having the rear surface incident-type PD device of the present invention with/from the optical fiber fixed on a ferrule.
Figure 22:
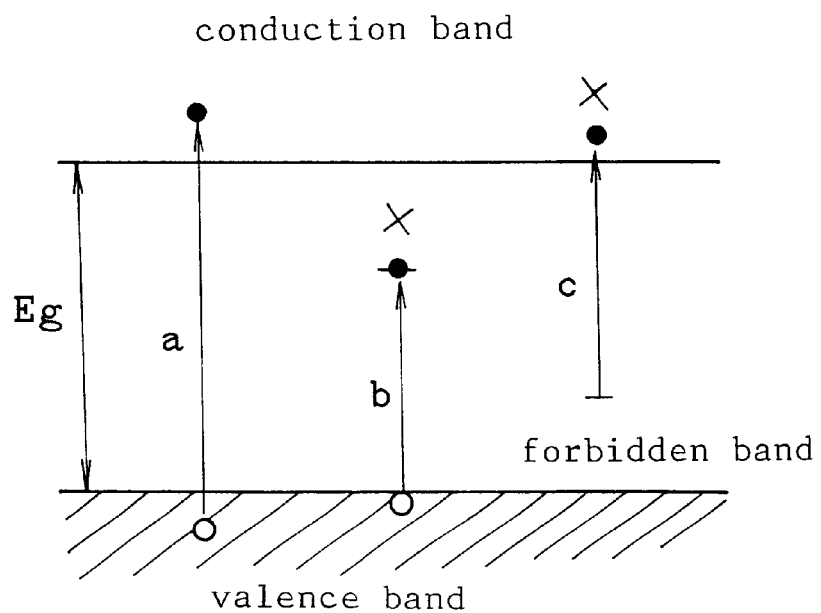
FIG. 22 is a band figure of an intrinsic semiconductor for explaining the principle based on the present invention.
Figure 23:
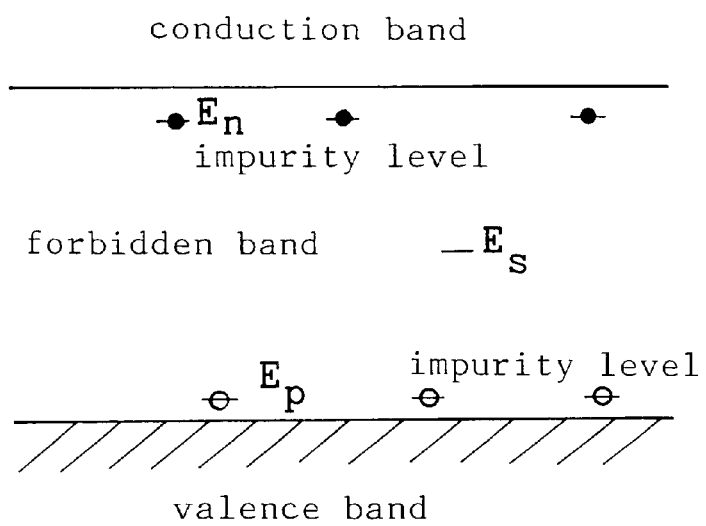
FIG. 23 is a band figure of a semiconductor having shallow impurity levels for explaining the principle based on the present invention.

The above-described pig tail-type PD module requires another optical connector for attaching or removing the optical fiber fixed in the module. Here, a receptacle-type photodiode module is cited as a photodiode module unifying the function of connector for attaching or removing an optical fiber. FIG. 21 shows a receptacle-type PD module including the PD chip of the present invention. Such a receptacle-type PD module is assembled from the PD mounted in the package shown in FIG. 19. A cylindrical PD fixing flange 140 is fixed on the stem 111.

The receptacle-type photodiode module has a dummy fiber holder 141 for holding a dummy fiber 142 in the upper part of the PD module. The dummy fiber 142 is a short fiber piece which is fixed to the dummy fiber holder 141. A female-type disc housing 143 with a screw is welded to the upper end surface of the fixing flange 140. A male screw part 147 is carved on the outer surface of the end 144 opposed to the female-type housing 143. A sleeve 148 is fitted into a hole penetrating the center of the housing 143. Several holes 146 for setscrews are perforated in a flange part 145 of the housing 143. This is the structure of female-type connector on the photodiode side.

A male-type connector 150 has a housing 151 fitted at a tip of a fiber code 152. An edge of the fiber 154 is protected by a ferrule 155. The ferrule is made from a material endowed with low friction, for example, zirconia. The ferrule 155 penetrates the housing 151. The side surface of the housing 151 has a cap nut 153 for fitting. The correlative position between two connectors is determined by inserting a key 156 formed on the housing side surface into a hole formed on the photodiode side.

The ferrule 155 is inserted into a sleeve 148, and the cap nut 153 is screwed with the male-screw part 147. The two connectors are unified by tightening the nut 153. The fiber 154 is in contact with the end of the dummy fiber 141 where the reflection of light becomes zero. The light emitted from the optical fiber passes through the dummy fiber 141, goes out of the end surface of the dummy fiber, is focused by a lens 126, and enters the PD chip 70. The receptacle-type allows to attach or to remove the optical fiber to/from the module.

The photodiode of the present invention is a rear-surface entrance type photodiode having a filter layer of a band gap wavelength λg lying between λ1 and λ2, an extra peripheral pn-junction encircling the central pn-junction and an electrode crossing the peripheral pn-junction for being in contact to both the n-region and the p-region.

Namely three points characterize the photodiode including an extra peripheral pn-junction of the present invention. The first feature is the insertion of the filter for extinguishing λ1. The filter has a band gap wavelength λg(λg=hc/Eg) intervening between λ1 and λ2.

The second feature is the peripheral ring pn-junction for suppressing the delay of response by absorbing electron-hole pairs yielded by the light beams entering the periphery. The annular region (p-region or n-region) encompassed by the peripheral pn-junction is named a "diffusion shield layer". The diffusion shield layer suppresses electrons and holes from diffusing.

The third feature is the bridging electrode (n-electrode or p-electrode) which is in contact with both the n-region and the p-region. The n-region and the p-region outside and inside of the diffusion shield layer are short-cut by the electrode. The electrode annihilates the pairs of electrons and holes generated by the light entering the peripheral part by short-cutting. The top n-electrode has another advantage. Since the n-electrode lies on the top of the PD chip, the new PD dispenses with a metallized pattern for a bottom n-electrode. Since all the electrodes ride on the top surface, the n-electrode and the p-electrode can be connected to pins or patterns by wirebonding. The bottom of the PD can be fixed to a package or a circuit board by an adhesive. Of course, the PD can also be mounted by metallizing a package or a circuit board, forming a ring metallized pattern on the bottom of the PD and soldering the bottom to the package or board. However, in this case, the metallized ring is not an electrode at all.

Feature 1

Filter Layer

Assuming two signal wavelengths are 1.3 µm and 1.55 µm for an InP-PD, this invention inserts a filter layer of a band gap wavelength λg (λg=hc/Eg) satisfying 1.3 µm <λg<1.55 µm between the incident surface and the InGaAs or InGaAsP light receiving layer. For example, a suitable filter layer is an InGaAsP layer having λg=1.42 µm. The InGaAsP mixture crystal of λg=1.42 µm satisfying the lattice fitting to InP is, in concrete, $In_{0.66}Ga_{0.34}As_{0.76}P_{0.24}$. The four-component mixture layer absorbs 1.3 µm light but allows 1.55 µm light to pass. Besides the InGaAsP of λg=1.42 µm, any InGaAsP mixture of λg intervening between 1.3 µm and 1.55 µm is available. Application of such an InGaAsP mixture on an InP substrate gives a filter which admits 1.55 µm light to pass through but absorbs 1.3 µm light.

The filter layer can be made both on the top surface and the bottom surface of the InP substrate. In any cases, the PDs are rear surface incident type PDs. The conductive type of the filter can be n-type, p-type or SI-type. The SI-type filter layer can save the insulating layer on the bottom.

Feature 2

Annular Diffusion Shield Layer

Besides the central pn-junction, the PD has a second peripheral ring pn-junction encompassing the central pn-junction. The second conductive part (p-region in the case of an n-InP substrate) enclosed the second pn-junction is the diffusion shield layer. An electrode is formed on the diffusion shield layer and on the first conductive layer outside of the diffusion shield layer for widening the depletion layer by the reverse bias voltage. Stray light reaching the periphery raises pairs of electrons and holes which induce photocurrents. The extra photocurrents are annihilated by the diffusion shield layer. Delayed parts are eliminated from signals.

Feature 3

Top Electrode Crossing the pn-junction

The peripheral top electrode rides on both the p-region and the n-region, crossing the peripheral pn-junction. The central top electrode and the peripheral circular top electrode compose a pair of electrodes. The bottom of the PD chip has no electrode. There is no metallized pattern on a package or a board, which is favorable for top surface installation.

This invention can be applied to any one of a semi-insulating (SI-) InP substrate, an n-type InP substrate and a p-type InP substrate. The most favorable one is the semi-insulating substrate, because the SI-substrate can save an insulating layer between the substrate and the bottom metallizing. The following show preferable assemblies of conduction types of the epitaxial layers (first conductive type), the central region (second conductive type), the diffusion shield layer (second condition type) and the central electrode, the peripheral electrode and the filter layer.

A. SI-InP substrate+n-epitaxial layer
  Epitaxial layers=n-type. Central part=p-region. Diffusion shield layer=p-region. Filter=n-, p-, or SI-type. Central electrode=p-electrode. Peripheral electrode=n-electrode.
B. n-InP substrate+n-epitaxial layer
  Epitaxial layers=n-type. Central part=p-region. Diffusion shield layer=p-region. Filter=n-, p-, or SI-type. Central electrode=p-electrode. Peripheral electrode=n-electrode.
C. p-InP substrate+p-epitaxial layer
  Epitaxial layers=p-type. Central part=n-region. Diffusion shield layer=n-region. Filter=n-, p-, or SI-type. Central electrode=n-electrode. Peripheral electrode=p-electrode.
D. SI-InP substrate+p-epitaxial layer
  Epitaxial layers=p-type. Central part=n-region. Diffusion shield layer=n-region. Filter=n-, p-, or SI-type. Central electrode=n-electrode. Peripheral electrode=p-electrode.

Figure 24:
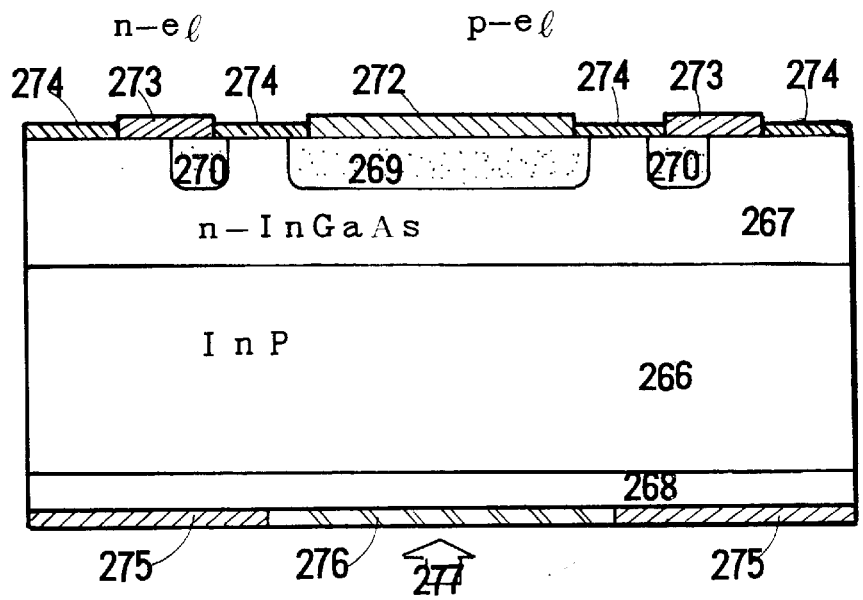
FIG. 24 is a sectional view of the photodiode having basic features of the present invention.

FIG. 24 shows a schematic view of a PD of the present invention in the case of an SI-InP substrate or an n-InP substrate. An InP substrate 266 includes both an SI-InP and an n-InP substrate. An n-InGaAs light receiving layer 267 is epitaxially grown on a top surface of the InP substrate 266. The epitaxial layer sometimes means a single layer but at other times includes a plurality of layers of InP, InGaAs, or InGasP. A filter layer 268 is epitaxially grown on a bottom surface of the Inp substrate 266. The filter layer 268 is an InGaAs mixture crystal of the absorption edge wavelength λg interposing between 1.3 µm and 1.55 µm. A filter having, e.g., λg=1.42 µm is $In_{0.66}Ga_{0.34}As_{0.76}P_{0.24}$. Other component ratios of InGaAsP satisfying λ1<λg<λ2 are also available for the filter layer.

A central p-region 269 is formed by thermal diffusion or ion-implantation of a p-type dopant at the center of the top of the epitaxial layer. A p-electrode 272 is deposited on the central p-region 269. Since the PD is the bottom-incidence type, the p-electrode 272 covers all the opening of the p-region 269. A ring p-region 270 is also formed by thermal diffusion or ion implantation of a p-type dopant at the periphery of the top. The central p-region and the peripheral p-region can be made at a stretch by a common step using a suitable mask. Solid lines show pn-junctions. Depletion layers accompany the pn-junctions on both sides. However the depletion layers are asymmetric in thickness due to the difference of the carrier density. The p-regions 270 and 269 are heavily doped with a p-dopant, e.g., Zn, Cd or Mg but the n-regions are poorly doped with an n-dopant. Thus, the depletion layer on the p-side is very thin. But the depletion layer on the n-side is thick. Then, the depletion layers mainly exist on the n-side of the pn-junctions. Crossing the peripheral pn-junction, an annular n-electrode 273 lies upon the p-region 270 and the n-region 267 for short-cutting the p-region 270 and the n-region 267. Extra portions are covered and protected with a passivation film 274. The top n-electrode 273 is a cathode to which a reverse bias is applied. The bottom of the Inp substrate has no n-electrode unlike conventional PDs.

Figure 34:
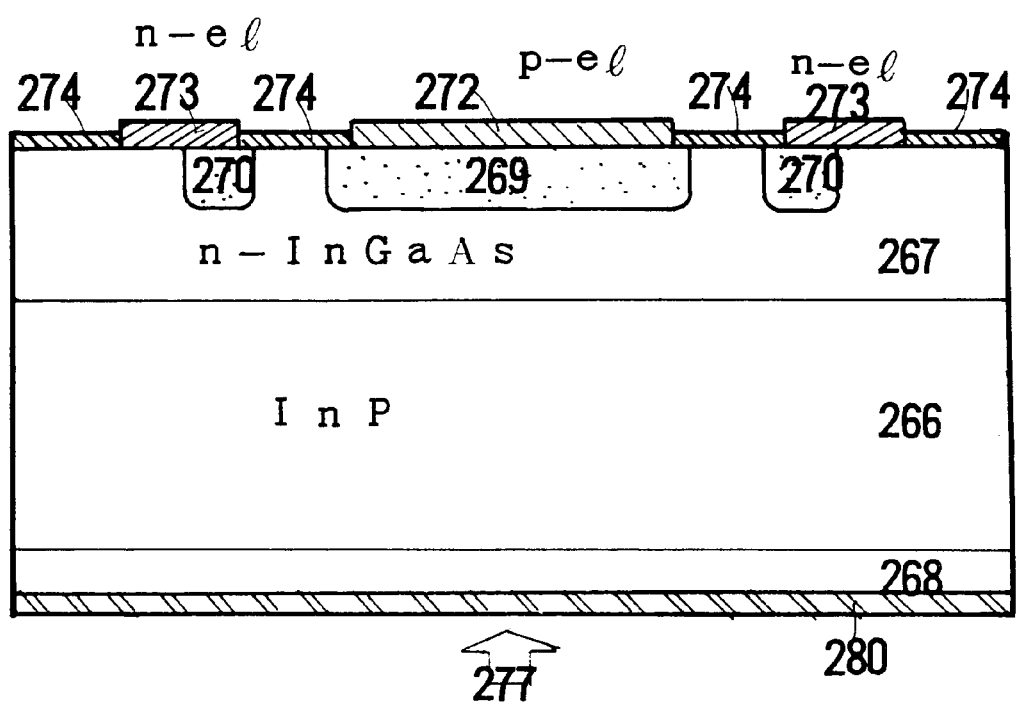
FIG. 34 is a sectional view of the photodiode having basic feature of the present invention without a ring bonding-metallizing at the bottom.

A ring bonding-metallizing 275 is formed at the periphery of the bottom of the filter layer 268 or the substrate 266. The bonding-metallizing 275 is not an n-electrode but a metal for bonding the chip on a metallized pattern by soldering. The metallizing 275 can fully be omitted by sticking the PD chip by an adhesive. FIG. 34 shows a sectional view of the PD without the metallizing 275. An antireflection film 276 is formed at the center of the bottom of the chip. Incident light 277 including 1+λ2 comes into the PD through the antireflection film 276. The filter 268 absorbs λ1. Only the light of λ2 arrives at the depletion layer in the n-InGaAs light receiving layer 267.

The reverse bias is applied between the peripheral n-electrode 273 and the central p-electrode 272. The n-InGaAs light receiving layer 267 has a higher resistance due to the poor carrier density. In the case of the n-InP substrate, the main electric field stands in the vertical direction between the p-electrode and the InP substrate and between the substrate and the n-electrode, since the Inp substrate has a low resistance. In the case of the SI-InP substrate, a low resistance buffer layer should be formed upon the SI-substrate. Thus the electric field is formed in the vertical direction. The central pn-junction is reverse biased for making a wide depletion layer on the n-InGaAs sides. Electrons borne by light in the central depletion layer make their way to the n-region 267 but holes run to the p-region 269. Both carries produce a photocurrent.

When stray light comes into the periphery of a prior PD, the pairs of electrons and holes borne by the light trek to the central n-region and the p-region by diffusion and induce a delay photocurrent which is called a "tail current". The present invention solves the problem of the delay by extinguishing the tail current.

When a pair of an electron and a hole is generated at the depletion layer in the vicinity of the peripheral p-region 270, the hole goes into the p-region 270. The electron progresses to the n-region. A charge of a hole goes into the electrode 273 from the p-region 270 and another charge of an electron goes into the same electrode 273 from the n-region. Both charges cancel with each other in the electrode 273. No external current occurs. Namely, the short-cut electrode 273 eliminates the tail of signals by extinguishing the extra pairs. The bridging electrode 273 solves the problem of the delay of response.

The Applicant of the present invention has proposed a photodiode having a peripheral pn-junction formed by an extra p-region (diffusion shield layer) at the periphery by ② Japanese Patent Laying Open No.4-111479 (111479/'92) (Application No.2-230208) "Photodiode" of Ichiro Tonai. The ends of the extra pn-junction appear on the sides of the chip without passivation. The incompleteness of the pn-junction short-cuts the p-region and n-region. ③ Japanese Patent Application No.10-174227 "Photodiode and photodiode module" of Yoshiki Kuhara and Hitoshi Terauchi suggested a photodiode having an extra peripheral p-region as a diffusion shield layer and an extra p-electrode on the diffusion shield layer for reversely biasing the peripheral pn-junction. Furthermore ④ U.S. Pat. No. 5,420,418 of Yasushi Fujimura, Ichiro Tonai proposed a PD having a peripheral p-region as a diffusion shield layer and an n-electrode on the peripheral p-region and the n-region for biasing reversely the p-region and the n-region. These are prior art by the same Applicant.

Embodiment ⑨ n-InP Substrate

Figure 25:
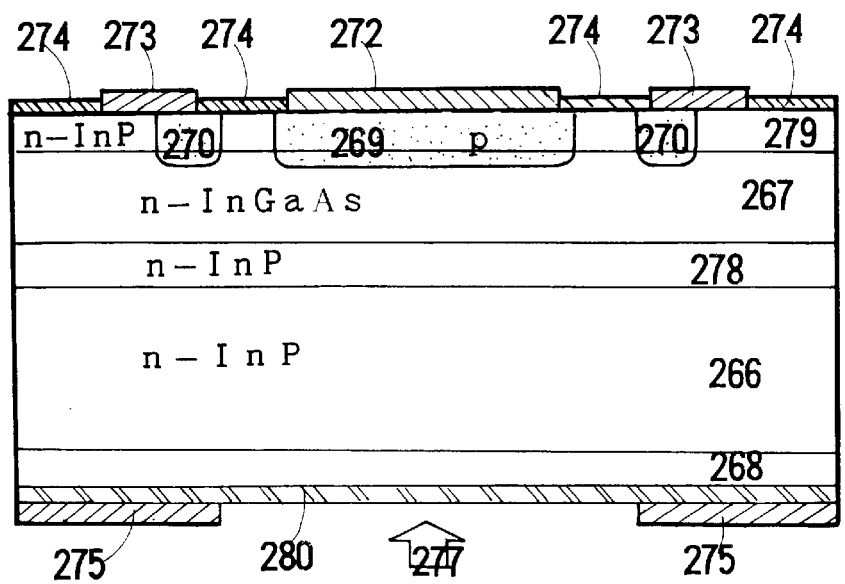
FIG. 25 is a sectional view of the photodiode built upon an n-InP substrate.

FIG. 25 shows a first embodiment of the photodiode built on an n-InP substrate. The substrate 266 is an n-type InP substrate. An n-InP buffer layer 278, an n-InGaAs light receiving layer 267 and an n-InP window layer 279 are epitaxially grown on the top surface of the n-InP substrate 266. A filter layer 268 of InGaAsP is grown on the bottom surface of the n-InP substrate 266. Such a both epitaxial wafer is the starting wafer. Compared with the basic structure of FIG. 24, embodiment ⑨ has the n-InP buffer layer 278 and the InP window layer 279 in addition. The InP window layer 279 which has a wider band gap than the InGaAs light receiving layer 267 absorbs the light of energy higher than the band gap. For cutting light of shorter wavelength, top incident type PDs often adopt such a window layer. However, bottom incident type PDs also employ the window layer. The InP window layer 279 has a higher dopant concentration than the InGaAs light receiving layer 267. The addition of the window layer 279 can lower the contact resistance of the electrodes.

An insulating antireflection layer 280 is formed upon the filter layer 268. The layer 280 covers all the bottom of the filter layer 268 for playing the role of insulating the PD and of preventing light from reflecting. In the case of n- or p-InP substrate, such an insulating layer 280 is indispensable for insulating the PD from a package or a circuit board. Furthermore a ring metallizing film 275 is formed on the periphery of the insulating film 280. The metallizing film 275 is not an n-electrode but only a metallized ring for die-bonding or soldering the PD to a package or a board. Incident light of (λ1+λ2) comes into the bottom incident PD through the bottom antireflection film 280. The filter layer 268 absorbs λ1. Only the light of λ2 reaches the depletion layer near the p-region 269 through the InP substrate 266, the InP buffer layer 278 and the InGaAs light receiving layer 267.

Figure 26:
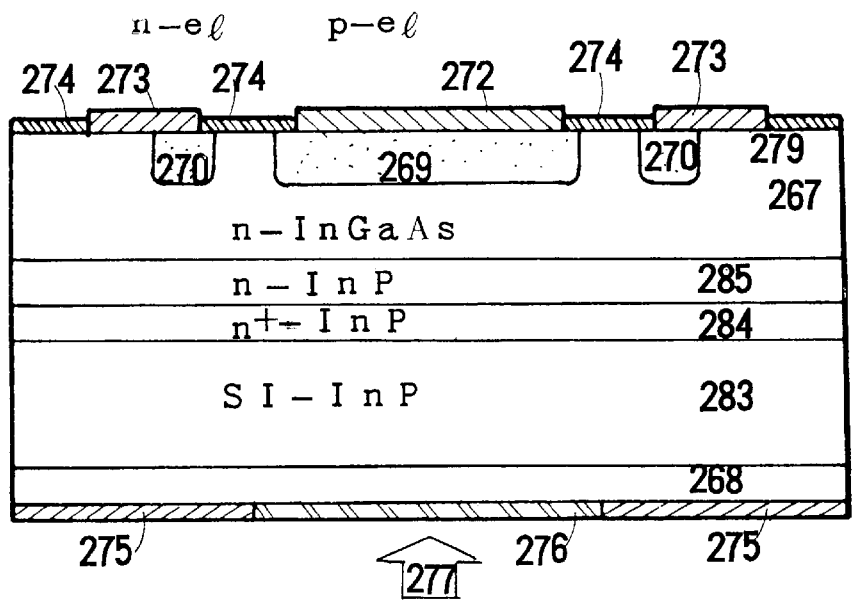
FIG. 26 is a sectional view of the PD having an SI-InP substrate.
Figure 27:
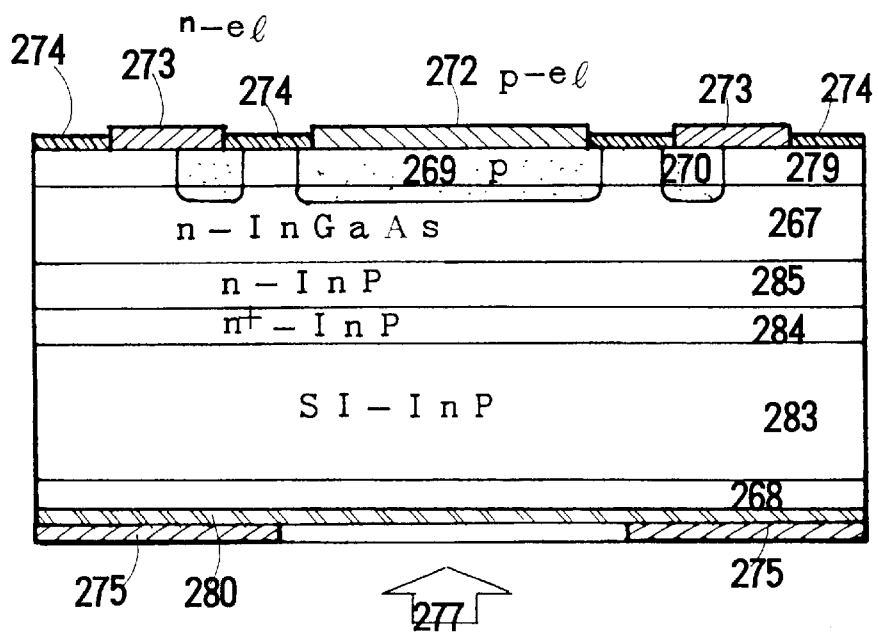
FIG. 27 is a sectional view of the PD having an SI-InP substrate.
Figure 29:
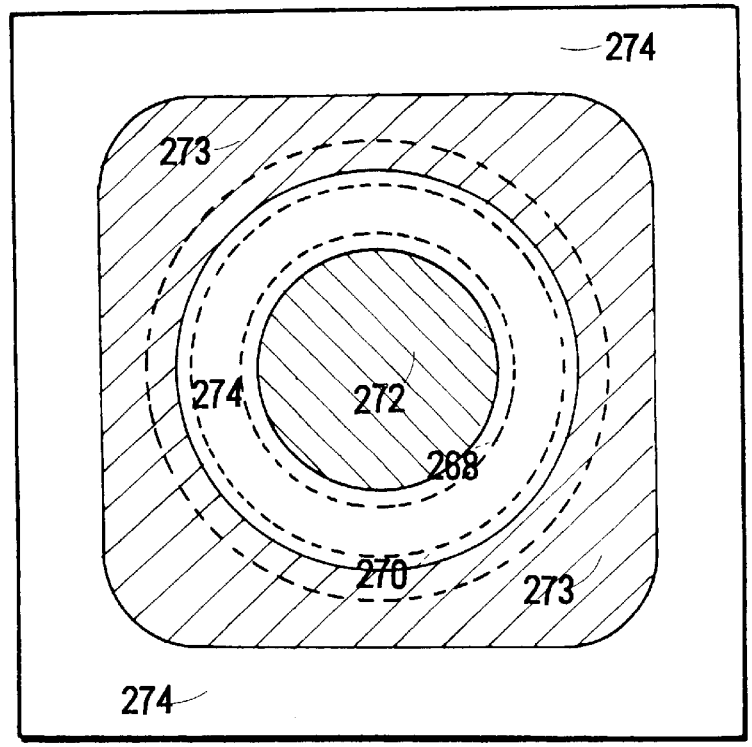
FIG. 29 is a plan view of the photodiode of the present invention.

FIG. 29 is a common plan view of the PDs of FIG. 25, FIG. 26 and FIG. 27. A circular p-region 269 which is denoted by a dotted circle is made by the Zn diffusion at the center. At the periphery, another round p-region 270 encircled by dotted lines is made by the Zn diffusion. An n-region intervenes between the central p-region 269 and the peripheral p-region 270. A p-electrode 272 is attached on the central p-region 269. An n-electrode 273 is deposited upon the peripheral p-region 270 and the neighboring n-region. Other parts of the top surface are covered with passivation films 274 of SiN or $SiO_2$. The p-electrode 272 is made from an alloy of AuZn. The n-electrode is made from strata of AuGeNi/Au/Ti/Au. These electrodes are excellent in ohmic contact and cohesion. A higher voltage is applied to the n-electrode and a lower voltage is applied to the p-electrode for the reverse bias. The reverse bias voltage produces vertical electric fields, which is similar to conventional PDs having a bottom n-electrode. The electric field increases the depth of the depletion layer accompanying the central pn-junction. The ordinary light coming into the central depletion layer just beneath the p-region 269 makes a photocurrent by producing pairs of holes and electrons. Stray light entering the periphery yields no resultant current owing to the cancellation by the peripheral p-region and the n-electrode.

Embodiment ⑩

Semi-insulating InP Substrate

A SI-InP substrate is superior to an n-InP substrate in insulation. FIG. 26 shows an embodiment of a PD having a SI-InP substrate 283 which is doped with Fe. The Fe-doped SI-InP substrate 283 is a rectangle of 0.5 mm×0.5 mm×0.3 mm of a resistivity of $10^7 \Omega cm$. The resistance is higher than 100MΩ in the direction of thickness.

An $n^+$-InP buffer layer 284, an n-InP buffer layer 285, an InGaAs light receiving layer 267 and an InP window layer 279 are epitaxially grown the top surface of the SI-InP substrate 283. An InGaAsP filter layer 268 is also epitaxial grown on the bottom of the wafer. The following are the parameters of the epitaxial wafer.

- $n^+$-IP buffer layer ... S-doped, $n=10^{18}$ cm$^{31\ 3}$, $d=2\sim4$ μm.
- n-InP buffer layer ... $n=1\sim5\times10^{15}$ cm$^{-1}$, $d=2\sim4$ μm.
- n-InGaAs(or InGaAsP) light receiving layer ... $n=1\sim5\times10^{15}$ cm$^{-3}$, $d=3\sim4$ μm.
- n-InP window layer ... $n=2\sim5\times10^{cm-3}$, $d=3\sim4$ μm.
- InGaAsP filter layer ... $\lambda g=1.4$ μm.

The central p-region 269 and the peripheral p-region 270 are produced by zinc diffusion through a mask having openings at the center and the peripheral circle. A p-electrode 272 is formed upon the central p-region 269. An n-electrode 273 is made upon the peripheral p-region 270 and the n-region 279. A metallizing ring 275 is formed on the bottom of the filter layer 268 for bonding or soldering the PD to a package or a circuit board. The metallizing ring 275 is not an n-electrode. A central opening of the filter layer 268 is coated with an antireflection film 276.

Since the substrate 283 is a semi-insulator, an additional highly-doped $n^+$-InP buffer layer 284 of a dopant concentration higher than $10^{18}$ cm$^{-3}$ is formed between the SI-substrate 283 and the normal InP. When the n-electrode is applied with higher voltage and the p-electrode 272 is applied with lower voltage, an electric field stands from the $n^+$-InP buffer layer 284 to the central p-region 269 by the reverse bias. Almost all the bias is applied to the depletion layer below the p-region 269. When incident light 277 of $\lambda1+\lambda2$ comes into the PD from the bottom opening, the shorter wavelength $\lambda1$ is absorbed by the filter layer 268. $\lambda2$ arrives at the depletion layer beneath the central pn-junction and generates pairs of electrons and holes which make a photocurrent. The insulation of the InP substrate does without an insulating film between the filter layer and the bottom metallizing ring 275.

Embodiment ⑪

Semi-insulating Substrate

FIG. 27 shows another embodiment having a semi-insulating substrate and an overall coating insulating film. An $n^+$-InP buffer layer 284, an n-InP buffer layer 285, an n-InGaAs light receiving layer 267 and an n-InP window layer 279 are epitaxially grown on a top surface of an SI-InP substrate 283. An InGaAsP filter layer 268 is grown on a bottom of the SI-InP substrate 283. Selective Zn-diffusion through a mask makes the central p-region 269 and the ring p-region 270 on the InP window layer 279 and the InGaAs receiving layer 267. An antireflection film 280 is formed on the whole InGaAsP filter layer 268. An annular metallizing 275 is made on the antireflection film 280 for die-bonding or soldering. The antireflection film 280 made from SiON, SIN, SiO$_2$ and so on has two roles of suppressing reflection and insulating the PD.

Embodiment ⑫

Coupling to Amplifier

Figure 28:
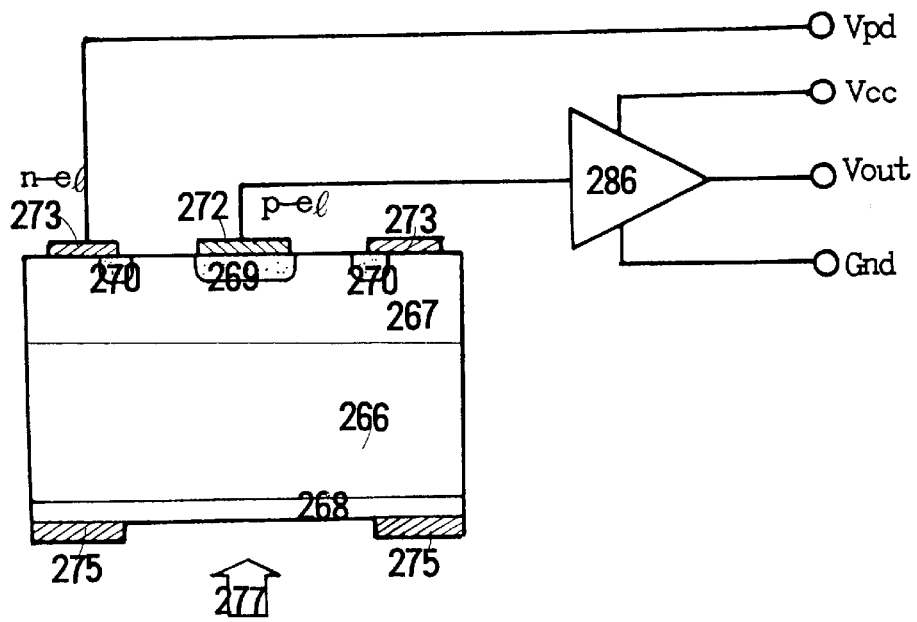
FIG. 28 is a circuit plan of the photodiode coupled to an amplifier.

FIG. 28 shows a circuit having the photodiode combined with an amplifier. The peripheral n-electrode 273 is connected to Vpd which is, e.g., 3.3V The p-electrode 272 is joined to an input of an amplifier 286. The amplifier 286 is, for example, an Si IC or a GaAs IC which is connected to Vcc (e.g., 3.3V) and to GND (0V). The incident light 277 containing $\lambda1$ and $\lambda2$ enters the PD from the bottom opening. The filter layer cuts $\lambda1$. Only $\lambda2$ arrives at the light receiving layer 267 and induces a photocurrent. The amplifier 286 amplifies the photocurrent.

Embodiment ⑬

Waveguide Type

Figure 30:
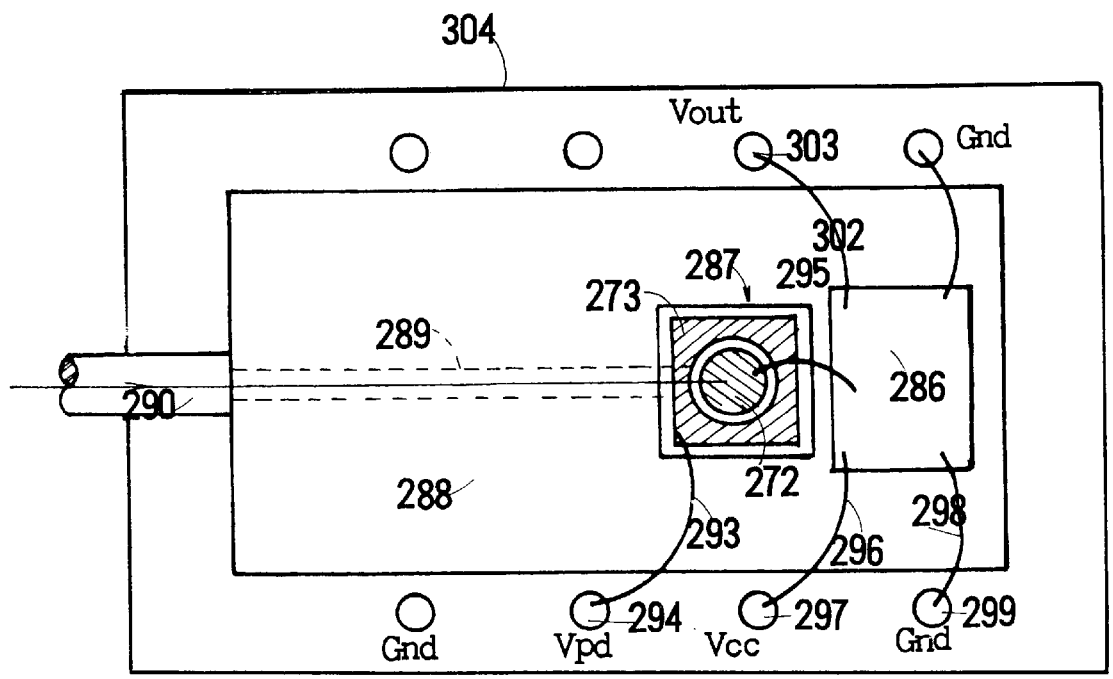
FIG. 30 is a plan view of a package having a silicon bench with a waveguide for holding the photodiode of the present invention.
Figure 31:
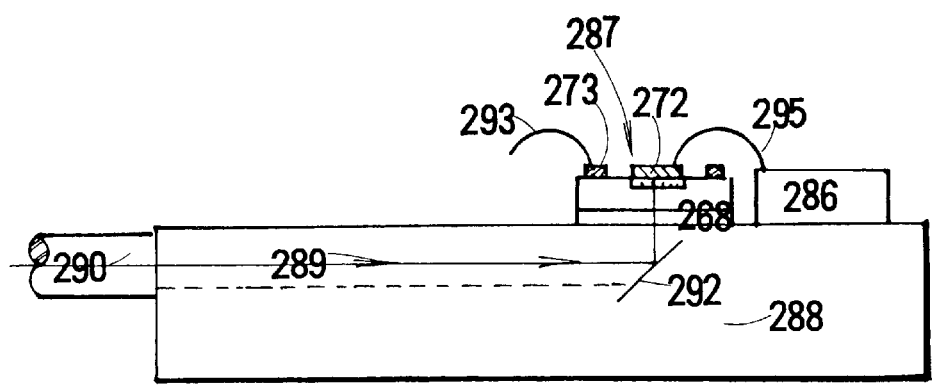
FIG. 31 is a vertical section of the silicon bench on which the photodiode is mounted.

The PD of the present invention has the n-electrode not on the bottom but on the top. The top n-electrode can save the metallizing pattern on a package or a circuit board. FIG. 30 and FIG. 31 demonstrate a waveguide type PD module for realizing the circuit of FIG. 28. A waveguide 289 with high refractive index is made along the central axial line on a Si bench 288. A 45 degree slanting mirror 292 is made on the midway of the waveguide 289, for example, by inserting a mirror plate or etching the Si bench anisotropically.

The PD chip 287 of the present invention is mounted on the silicon bench 288 just above the mirror 292. The bottom is not an n-electrode, which allows the silicon bench to dispense with the metallizing pattern. The PD chip can be stuck to the Si bench with an adhesive. The amplifier chip 286 is mounted at the back of the PD 287. An end of an optical fiber 290 is glued to a front end of the waveguide 289. The central p-electrode 272 is joined to an input of the amplifier 286 with a wire 295. The n-electrode 273 is connected to Vpd pin 294 with a wire 293. GND pad of the amplifier 286 is coupled to GND pin 299 by a wire 298. A source pad is connected to Vcc pin 297 with a wire 296. The output of the amplifier is joined to Vout pin 303 via a wire 302. Amplified signal is taken out from Vout pin 303. Signal light having $\lambda1+\lambda2$ comes from the fiber 290 to the PD 287 via the waveguide 289. $\lambda1$ is removed by the filter layer 268. $\lambda2$ induces a photocurrent in the PD. The photocurrent is converted to a voltage signal by the amplifier 286. Since the n-electrode lies at the top, the Si bench can do without the metallizing pattern for wiring of the bottom n-electrode.

The embodiment adopts a PD of a light receiving opening of a 80 μm diameter. The mirror 292 is produced by etching a Si (111) plane slanting to the surface at 45 degrees with anisotropic etchant. The optical fiber 290 is a single-mode fiber. The end of the fiber is glued to the waveguide with a transparent adhesive. A package 304 is a metal box-type package.

Vcc=Vpd=3V and Gnd=0V are applied to the pins. Laser beams modulated by 155 Mbps digital signal enter the PD via the fiber 290 and the waveguide 289. The BER is measured for the signal. The error rate is $10^{-8}$. The minimum sensitivity is −35 dBm. The maximum sensitivity is 0 dBm. The cancellation of the tail current increases the tolerance of alignment of the fiber to the waveguide. All the samples reveal good performance. The top n-electrode shortens the time of assembly by excluding the step of making the metallized pattern on the package.

Embodiment ⑭

Buried Fiber Type

Figure 32:
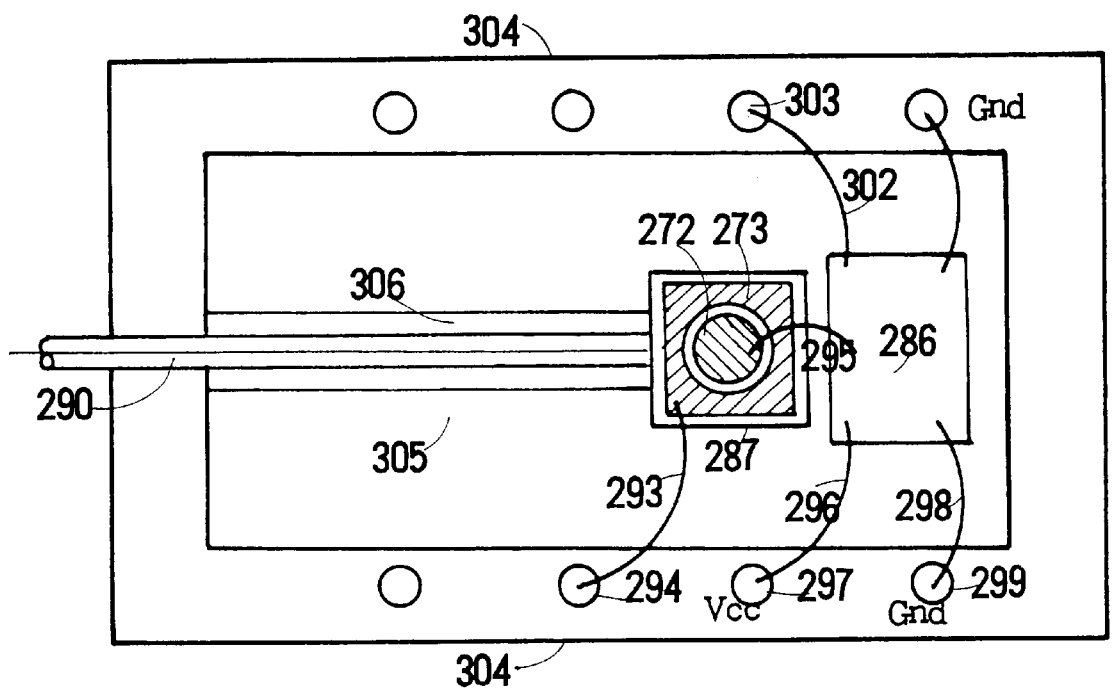
FIG. 32 is a plan view of a package of the PD having a silicon bench with a V-groove for supporting an optical fiber.
Figure 33:
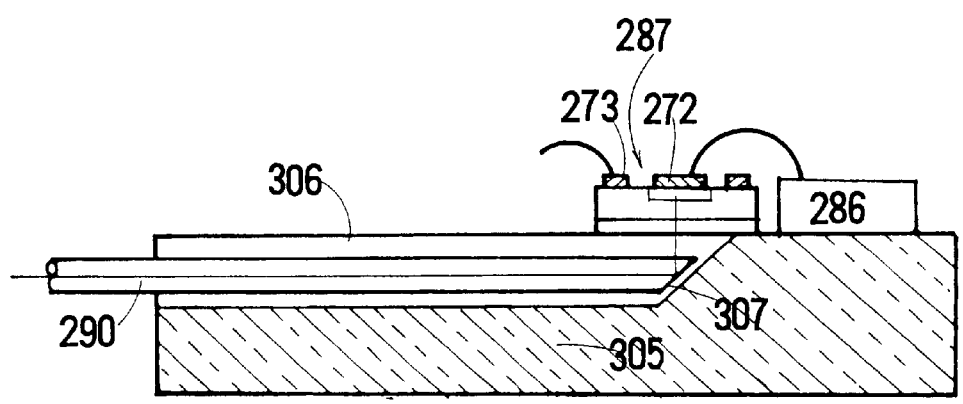
FIG. 33 is a sectional view of the silicon bench maintaining the PD and the fiber.

FIG. 32 and FIG. 33 show another embodiment of a photodiode module of buried fiber type. A V-groove 306 is cut on a central axial line on a silicon bench 305. An optical fiber 290 having an oblique-cut end 307 is inserted and fixed in the V-groove 306. The PD chip 287 is fixed on the silicon bench above the end of the groove. An amplifier 286 is positioned on the Si bench at the back of the PD 287. Propagating in the fiber 290, reflecting upward on the slanting fiber end 307, $\lambda1+\lambda2$ light signals come into the PD from the bottom. $\lambda1$ is eliminated in the filter. Only $\lambda2$ is sensed by the PD.

What we claim is:

1. A photodiode module including optical transmission media and a photodiode chip for sensing light having a second wavelength of λ2 longer than a first wavelength of λ1 in an optical communication arrangement using light having wavelengths λ1 and λ2, comprising:
- a first conductive-type p- or n-type semiconductor substrate;
- a first conductive-type light receiving layer epitaxially grown on a surface of the semiconductor substrate;
- a second conductive-type p- or n-type region formed on a part of the light receiving layer by doping a second-conductive type impurity opposed to the first conductive-type semiconductor substrate;
- a pn-junction formed in the light receiving layer;
- a second conductive-type electrode formed on the second conductive-type region;
- a filter layer comprising n- or p-type semiconductor crystal epitaxially grown on the other surface of the substrate having a bandgap lower than λ1 light and higher than λ2 light in energy; and
- a first conductive-type ring electrode including an opening part and formed on the filter layer;
- wherein the λ1 light and the λ2 light pass through the opening part of the first conductive-type electrode, the λ1 light is absorbed by the filter layer and the λ2 light reaches the pn-junction of the light receiving layer, the photodiode chip is optically connected to the optical transmission media which are optical fibers, optical waveguides or optical guides via a lens or without a lens, the light emitted from the optical transmission media passes through the opening of the first conductive-type electrode of the photodiode and reaches the pn-junction of the light receiving layer.

2. A photodiode module including optical transmission media and a photodiode chip for sensing light having a second wavelength of λ2 longer than a first wavelength of λ1 an optical communication arrangement using light having wavelengths λ1 and λ2, comprising:
- a first conductive-type p- or n-type semiconductor substrate;
- a first conductive-type light receiving layer epitaxially grown on a surface of the semiconductor substrate;
- a second conductive-type p- or n-type region formed on a part of the light receiving layer by doping a second-conductive type impurity opposed to the first conductive-type semiconductor substrate;
- a pn-junction formed in the light receiving layer;
- a second conductive-type electrode formed on the second conductive-type region;
- a filter layer comprising n- or p-type semiconductor crystal epitaxially grown on the other surface of the substrate, having a bandgap lower than λ1 light and higher than the λ2 light in energy and a thickness having a transmittance of the λ1 light of less than 3%; and
- a first conductive-type ring electrode including an opening part and formed on the filter layer;
- wherein the λ1 light and the λ2 light pass through the opening part of the first conductive-type electrode, the λ1 light is absorbed by the filter layer and the λ2 light reaches the pn-junction of the light receiving layer, the photodiode chip is optically connected to the optical transmission media which are optical fibers, optical waveguides or optical guides via a lens or without a lens, the light emitted from the optical transmission media passes through the opening of the first conductive-type electrode of the photodiode and reaches the pn-junction of the light receiving layer.

3. A photodiode module as claimed in claim 1, wherein the first wavelength λ1 is 1.3 $\mu$m and the second wavelength λ2 ranges from 1.5 $\mu$m to 1.6 $\mu$m.

4. A photodiode module as claimed in claim 3, wherein the first conductive-type is n-type and the second conductive-type is p-type, the substrate is made from n-InP single crystal, the light receiving layer is made from n-InGaAs, a p-type region is formed on the middle part of the light receiving layer by doping a p-type impurity, a p-electrode is placed in the p-type region, the filter layer is made from n-type or p-type $In_{0.66}Ga_{0.34}As_{0.76}P_{0.24}$ and an n-electrode is positioned on the filter layer.

5. A photodiode module as claimed in claim 4, wherein the thickness of the n- or p-type $In_{0.66}Ga_{0.34}As_{0.76}P_{0.24}$ filter layer is more than 5 $\mu$m.

6. A photodiode module as claimed in claim 5, wherein an InP window layer is positioned between the InGaAs light receiving layer and the p-electrode, and the periphery of the InP window layer, not covered with the p-electrode is coated with a passivation layer.

7. A photodiode module as claimed in claim 1, wherein the second conductive-type electrode of the photodiode chip is fitted on a submount, the photodiode is hermetically sealed in a package via the submount, a tip of the optical fiber is fixed to the package as opposing the opening of the first conductive-type electrode, and the optical fiber and the photodiode are optically connected to each other via a lens fixed to the package.

8. A photodiode module as claimed in claim 1, wherein the photodiode module has a first connector for holding the end of the optical fiber and a second connector having a package fixing the photodiode, the first and the second connectors can be attached or removed to/from the optical fiber, and the incident light from the optical fiber enters the photodiode when the first connector is connected to the second connector.

9. A photodiode module as claimed in claim 1, wherein end surfaces of the optical transmission media is slantingly cut off, the photodiode chip is fixed to a side surface of the optical transmission media as being in contact with the first conductive-type electrode, and the light reflected by the slantingly cut surfaces of the optical transmission media enters the photodiode via the ring-type opening of the first conductive-type electrode.

10. A photodiode module as claimed in claim 1, wherein the photodiode module has a submount for fixing the photodiode as keeping the photodiode side surface in the same plane and a guide block including a part for fixing an end of the optical fiber and a part for fixing the submount and the incident end surface of the optical fiber is directly opposed to the photodiode without intervening a lens by fixing the optical fiber and the submount having the photodiode to the guide block.

11. A photodiode module including optical transmission media and a photodiode chip for sensing light having a second wavelength of λ2 longer than a first wavelength of λ1 in an optical communication arrangement using light having wavelengths λ1 and λ2, comprising:
- a photodiode; and
- a package for holding the photodiode;
- wherein the photodiode includes:
  - a first conductive-type of an n- or p-type semiconductor substrate having a top surface and a bottom surface;

a filter layer consisting of an n- or p-type semiconductor crystal epitaxially grown on the top or bottom surface of the substrate, having a band gap energy lower than λ1 light but higher than λ2 light;

a first conductive type light receiving layer epitaxially grown on a top surface of the filter layer or on the top surface of the substrate;

a central second conductive-type region of a p- or n-type formed on a central part of the light receiving layer by doping a second conductive type impurity;

a first pn-junction between the central second conductive-type region and the first conductive-type light receiving layer;

a peripheral second conductive-type diffusion shield layer of a p- or n-type formed on a peripheral part of the light receiving layer for enclosing the central second conductive-type region by doping a second conductive type impurity;

a second pn-junction between the peripheral second conductive-type diffusion shield layer and the first conductive-type light receiving layer;

a second conductive-type electrode formed on the central second conductive-type region;

a first conductive-type electrode formed both on the peripheral second conductive-type diffusion shield and on the first conductive-type layer; and an opening for introducing light covered with an anti-reflection film made on the bottom surface of the substrate or the filter layer;

wherein λ1 and λ2 light pass the opening, λ1 light is absorbed by the filter layer, only the λ2 light reaches the first pn-junction in the light receiving layer, and the peripheral first conductive-type electrode short cuts the second peripheral pn-junction.

12. A photodiode module including optical transmission media and a photodiode chip for sensing light having a second wavelength of λ2 longer than a first wavelength of λ1 in an optical communication arrangement using light having wavelengths λ1 and λ2, comprising:

a photodiode; and a package for holding the photodiode;

wherein the photodiode includes:

a first conductive-type of an n- or p-type semiconductor substrate having a top surface and a bottom surface;

a filter layer consisting of an n- or p-type semiconductor crystal epitaxially grown on the top or bottom surface of the substrate, having a band gap energy lower than λ1 light but higher than λ2 light and having a thickness having a transmittance less than 3% for λ1 light;

a first conductive type light receiving layer epitaxially grown on a top surface of the filter layer or on the top surface of the substrate;

a central second conductive-type region of a p- or n-type formed on a central part of the light receiving layer by doping a second conductive type impurity;

a first pn-junction between the central second conductive-type region and the first conductive-type light receiving layer;

a peripheral second conductive-type diffusion shield layer of a p- or n-type formed on a peripheral part of the light receiving layer for enclosing the central second conductive-type region by doping a second conductive type impurity;

a second pn-junction between the peripheral second conductive-type diffusion shield layer and the first conductive-type light receiving layer;

a second conductive-type electrode formed on the central second conductive-type region;

a first conductive-type electrode formed both on the peripheral second conductive-type diffusion shield and on the first conductive-type layer; and an opening for introducing light covered with an anti-reflection film made on the bottom surface of the substrate or the filter layer;

wherein λ1 light and λ2 light pass the opening, λ1 light is absorbed by the filter layer, only the λ2 light reaches the first pn-junction in the light receiving layer, and the peripheral first conductive-type electrode short cuts the second peripheral pn-junction.

13. A photodiode module as claimed in claim 11, wherein the first conductive-type is n-type, the second conductive-type is p-type, the substrate is an n-InP substrate, the first conductive buffer layer is an n-InP buffer layer, the light receiving layer is an n-InGaAs or n-InGaAsP layer, the window layer in an n-InP window layer and the filter layer is an n-InGaAsP layer having a band gap wider than that of the n-nGaAs or n-InGaAsP light receiving layer.

14. A photodiode module including optical transmission media and a photodiode chip for sensing light having a second wavelength of λ2 longer than a first wavelength of λ1 in an optical communication arrangement using light having wavelengths λ1 and λ2, comprising:

an amplifier;

a photodiode; and a package for holding the photodiode and the amplifier;

wherein the photodiode includes:

a first conductive-type of an n- or p-type semiconductor substrate having a top surface and a bottom surface;

a filter layer consisting of an n- or p-type semiconductor crystal epitaxially grown on the top or bottom surface of the substrate, having a band gap energy lower than a first wavelength λ1 light but higher than a second wavelength λ2 light;

a first conductive type light receiving layer epitaxially grown on a top surface of the filter layer or on the top surface of the substrate;

a central second conductive-type region of a p- or n-type formed on a central part of the light receiving layer by doping a second conductive type impurity;

a first pn-junction between the central second conductive-type region and the first conductive-type light receiving layer;

a peripheral second conductive-type diffusion shield layer of a p- or n-type formed on a peripheral part of the light receiving layer for enclosing the central second conductive-type region by doping a second conductive type impurity;

a second pn-junction between the peripheral second conductive-type diffusion shield layer and the first conductive-type light receiving layer;

a second conductive-type electrode formed on the central second conductive-type region;

a first conductive-type electrode formed both on the peripheral second conductive-type diffusion shield and on the first conductive-type layer; and an opening for introducing light covered with an anti-reflection film made on the bottom surface of the substrate or the filter layer;

wherein λ1 light and λ2 light pass the opening, λ1 light is absorbed by the filter layer, only the λ2 light reaches the first pn-junction in the light receiving layer, and the peripheral first conductive-type electrode short cuts the second peripheral pn-junction.

15. A photodiode module as claimed in claim 14, wherein the package includes a silicon bench and a metal package, the silicon bench has a waveguide on a surface and a mirror made at a spot of the waveguide, the photodiode is mounted on the silicon bench above the mirror, the amplifier is mounted at the back of the photodiode on the silicon bench, an end of an optical fiber is stuck to the waveguide and the silicon bench is stored in the metal package.

16. A photodiode module as claimed in claim 14, wherein the package includes a silicon bench and a metal package, wherein the silicon bench has a V-groove, the photodiode and the amplifier are mounted on the silicon bench, an optical fiber having a slanting cut end is inserted into the V-groove and the silicon bench is stored in the metal package.

17. A photodiode module including optical transmission media and a photodiode chip for sensing light having a second wavelength of $\lambda 2$ longer than a first wavelength of $\lambda 1$ in an optical communication arrangement using light having wavelengths $\lambda 1$ and $\lambda 2$, comprising:

a photodiode; and a package for holding the photodiode;

wherein the photodiode includes:

a semi-insulator substrate having a top surface and a bottom surface;

a filter layer consisting of an n- or p-type semiconductor crystal epitaxially grown on the top or bottom surface of the substrate, having a band gap energy lower than $\lambda 1$ light but higher than $\lambda 2$ light;

a first conductive type light receiving layer epitaxially grown on a top surface of the filter layer or on the top surface of the substrate;

a central second conductive-type region of a p- or n-type formed on a central part of the light receiving layer by doping a second conductive type impurity;

a first pn-junction between the central second conductive-type region and the first conductive-type light receiving layer;

a peripheral second conductive-type diffusion shield layer of a p- or n-type formed on a peripheral part of the light receiving layer for enclosing the central second conductive-type region by doping a second conductive type impurity;

a second pn-junction between the peripheral second conductive-type diffusion shield layer and the first conductive-type light receiving layer;

a second conductive-type electrode formed on the central second conductive-type region;

a first conductive-type electrode formed both on the peripheral second conductive-type diffusion shield and on the first conductive-type layer; and an opening for introducing light covered with an anti-reflection film made on the bottom surface of the substrate or the filter layer;

wherein $\lambda 1$ and $\lambda 2$ light pass the opening, $\lambda 1$ light is absorbed by the filter layer, only the $\lambda 2$ light reaches the first pn-junction in the light receiving layer, and the peripheral first conductive-type electrode short cuts the second peripheral pn-junction.

18. A photodiode module including optical transmission media and a photodiode chip for sensing light having a second wavelength of $\lambda 2$ longer than a first wavelength of $\lambda 1$ in an optical communication arrangement using light having wavelengths $\lambda 1$ and $\lambda 2$, comprising:

a photodiode; and a package for holding the photodiode;

wherein the photodiode includes:

a semi-insulator substrate having a top surface and a bottom surface;

a filter layer consisting of an n- or p-type semiconductor crystal epitaxially grown on the top or bottom surface of the substrate, having a band gap energy lower than $\lambda 1$ light but higher than $\lambda 2$ light and having a thickness having a transmittance less than 3% for $\lambda 1$ light;

a first conductive type light receiving layer epitaxially grown on a top surface of the filter layer or on the top surface of the substrate;

a central second conductive-type region of a p- or n-type formed on a central part of the light receiving layer by doping a second conductive type impurity;

a first pn-junction between the central second conductive-type region and the first conductive-type light receiving layer;

a peripheral second conductive-type diffusion shield layer of a p- or n-type formed on a peripheral part of the light receiving layer for enclosing the central second conductive-type region by doping a second conductive type impurity;

a second pn-junction between the peripheral second conductive-type diffusion shield layer and the first conductive-type light receiving layer;

a second conductive-type electrode formed on the central second conductive-type region;

a first conductive-type electrode formed both on the peripheral second conductive-type diffusion shield and on the first conductive-type layer; and an opening for introducing light covered with an anti-reflection film made on the bottom surface of the substrate or the filter layer;

wherein $\lambda 1$ light and $\lambda 2$ light pass the opening, $\lambda 1$ light is absorbed by the filter layer, only the $\lambda 2$ light reaches the first pn-junction in the light receiving layer, and the peripheral first conductive-type electrode short cuts the second peripheral pn-junction.

19. A photodiode module as claimed in claim 17, wherein the first conductive-type is n-type, the second conductive-type is p-type, the substrate is a semi-insulating InP substrate, a buffer layer consists of a first buffer layer and a second buffer layer, the first buffer layer is a sulfur-doped low resistance n-InP layer, the second buffer layer is a high resistance n-InP layer, the light receiving layer is an n-InGaAs or n-InGaAsP layer, the window layer is an n-InP window layer and the filter layer is an n-InGaAsP layer having a band gap wider than that of the n-InGaAs or n-InGaAsP light receiving layer.

20. A photodiode module including optical transmission media and a photodiode chip for sensing light having a second wavelength of $\lambda 2$ longer than a first wavelength of $\lambda 1$ in an optical communication arrangement using light having wavelengths $\lambda 1$ and $\lambda 2$, comprising:

a photodiode; and a package for holding the photodiode;

wherein the photodiode includes:

a semi-insulator substrate having a top surface and a bottom surface;

a filter layer consisting of an n- or p-type semiconductor crystal epitaxially grown on the top or bottom surface of the substrate, having a band gap energy lower than a first wavelength $\lambda 1$ light but higher than a second wavelength $\lambda 2$ light;

a first conductive type light receiving layer epitaxially grown on a top surface of the filter layer or on the top surface of the substrate;

a central second conductive-type region of a p- or n-type formed on a central part of the light receiving layer by doping a second conductive type impurity;

a first pn-junction between the central second conductive-type region and the first conductive-type light receiving layer;

a peripheral second conductive-type diffusion shield layer of a p- or n-type formed on a peripheral part of the light receiving layer for enclosing the central second conductive-type region by doping a second conductive type impurity;

a second pn-junction between the peripheral second conductive-type diffusion shield layer and the first conductive-type light receiving layer;

a second conductive-type electrode formed on the central second conductive-type region;

a first conductive-type electrode formed both on the peripheral second conductive-type diffusion shield and on the first conductive-type layer; and an opening for introducing light covered with an anti-reflection film made on the bottom surface of the substrate or the filter layer;

wherein $\lambda 1$ light and $\lambda 2$ light pass the opening, $\lambda 1$ light is absorbed by the filter layer, only the $\lambda 2$ light reaches the first pn-junction in the light receiving layer, and the peripheral first conductive-type electrode short cuts the second peripheral pn-junction.

21. A photodiode module as claimed in claim 20, wherein a package includes a silicon bench and a metal package, the silicon bench has a waveguide on a surface and a mirror made at a spot of the waveguide, the photodiode is mounted on the silicon bench above the mirror, an amplifier is mounted at the back of the photodiode on the silicon bench, an end of an optical fiber is stuck to the waveguide and the silicon bench is stored in the metal package.

22. A photodiode module as claimed in claim 20, wherein the package includes a silicon bench and a metal package, wherein the silicon bench has a V-groove, the photodiode and an amplifier are mounted on the silicon bench, an optical fiber having a slanting cut end is inserted into the V-groove and the silicon bench is stored in the metal package.

* * * * *